United States Patent
Langmaid et al.

(10) Patent No.: US 9,391,223 B2
(45) Date of Patent: Jul. 12, 2016

(54) PHOTOVOLTAIC SHEATHING ELEMENT WITH A FLEXIBLE CONNECTOR ASSEMBLY

(75) Inventors: Joseph A Langmaid, Caro, MI (US); James R Keenihan, Midland, MI (US); Michael E Mills, Midland, MI (US); Leonardo C Lopez, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 208 days.

(21) Appl. No.: 14/004,444

(22) PCT Filed: Mar. 22, 2012

(86) PCT No.: PCT/US2012/030028
§ 371 (c)(1),
(2), (4) Date: Sep. 11, 2013

(87) PCT Pub. No.: WO2012/154307
PCT Pub. Date: Nov. 15, 2012

(65) Prior Publication Data
US 2014/0000709 A1 Jan. 2, 2014

Related U.S. Application Data

(60) Provisional application No. 61/466,239, filed on Mar. 22, 2011.

(51) Int. Cl.
*H01L 31/042* (2014.01)
*H01L 31/048* (2014.01)
(Continued)

(52) U.S. Cl.
CPC ............ *H01L 31/0483* (2013.01); *H01L 31/05* (2013.01); *H01L 31/18* (2013.01);
(Continued)

(58) Field of Classification Search
CPC ............ H01L 31/02008; H01L 31/052; H01L 31/048; H02S 20/25

USPC .................................................. 136/244, 256
See application file for complete search history.

(56) References Cited

U.S. PATENT DOCUMENTS 3,381,082 A 4/1968 LeBraun
3,767,471 A 10/1973 Kasper et al.
(Continued)

FOREIGN PATENT DOCUMENTS

DE 29605510 U1 5/1996
EP 0841706 A2 5/1998
(Continued)

OTHER PUBLICATIONS

English Translation of Japanese Office action for Japanese application No. 2014-501224, dated Oct. 7, 2014.
(Continued)

*Primary Examiner* — Jayne Mershon
(74) *Attorney, Agent, or Firm* — The Dobrusin Law Firm, P.C.

(57) ABSTRACT

The present invention is premised upon an assembly including at least a photovoltaic sheathing element capable of being affixed on a building structure, the sheathing element including at least: a photovoltaic cell assembly, a body portion attached to one or more portions of the photovoltaic cell assembly; at least a first and a second connector assembly disposed on opposing sides of the sheathing element and capable of directly or indirectly electrically connecting the photovoltaic cell assembly to at least two adjoining devices that are affixed to the building structure and wherein at least one of the connector assemblies includes a flexible portion; one or more connector pockets disposed in the body portion the pockets capable of receiving at least a portion of the connector assembly.

16 Claims, 14 Drawing Sheets

(51) Int. Cl.
  *H01L 31/05* (2014.01)
  *H01L 31/18* (2006.01)
  *H02S 20/25* (2014.01)
  *H02S 40/36* (2014.01)

(52) U.S. Cl.
  CPC ............... *H02S 20/25* (2014.12); *H02S 40/36* (2014.12); *Y02B 10/12* (2013.01); *Y02E 10/50* (2013.01); *Y10T 29/49355* (2015.01)

(56) References Cited

U.S. PATENT DOCUMENTS

| | | | |
|---|---|---|---|
| 4,465,575 | A | 8/1984 | Love et al. |
| 5,590,495 | A | 1/1997 | Bressler et al. |
| 5,961,740 | A | 10/1999 | Wambach |
| 5,986,203 | A | 11/1999 | Hanoka et al. |
| 5,990,414 | A | 11/1999 | Posnansky |
| 6,840,799 | B2 | 1/2005 | Yoshikawa et al. |
| 6,875,914 | B2 | 4/2005 | Guha et al. |
| 6,948,976 | B2 | 9/2005 | Goodwin et al. |
| 6,955,558 | B1 | 10/2005 | Low et al. |
| 7,012,188 | B2 | 3/2006 | Erling |
| 7,053,775 | B2 | 5/2006 | Moore |
| 7,387,537 | B1 | 6/2008 | Daily et al. |
| 7,445,508 | B2 | 11/2008 | Daily et al. |
| 7,592,537 | B1 | 9/2009 | West |
| 7,625,238 | B2 | 12/2009 | Duesterhoeft |
| 7,642,449 | B2 | 1/2010 | Korman et al. |
| 7,654,843 | B2 | 2/2010 | Olson et al. |
| 7,655,508 | B2 | 2/2010 | Johnson et al. |
| 7,681,363 | B2 | 3/2010 | Banister |
| 7,708,593 | B1 | 5/2010 | Gherardini et al. |
| 7,713,089 | B2 | 5/2010 | Faust et al. |
| 2001/0021109 | A1 | 9/2001 | Schleifer |
| 2002/0043031 | A1 | 4/2002 | Egushi et al. |
| 2005/0011550 | A1 | 1/2005 | Chittibabu et al. |
| 2005/0059282 | A1 | 3/2005 | Uchida et al. |
| 2007/0256734 | A1 | 11/2007 | Guha et al. |
| 2008/0101002 | A1 | 5/2008 | Kim et al. |
| 2008/0115822 | A1 | 5/2008 | Cunningham et al. |
| 2008/0135088 | A1 | 6/2008 | Corrales |
| 2008/0190047 | A1 | 8/2008 | Allen |
| 2008/0302030 | A1* | 12/2008 | Stancel ............. H01L 31/02008 52/173.3 |
| 2009/0311910 | A1 | 12/2009 | Kleinke |
| 2010/0146878 | A1 | 6/2010 | Koch |
| 2010/0147362 | A1* | 6/2010 | King ...................... F24J 2/4614 136/251 |
| 2010/0180523 | A1 | 7/2010 | Lena et al. |
| 2010/0326705 | A1 | 12/2010 | Chuo |

FOREIGN PATENT DOCUMENTS

| | | |
|---|---|---|
| EP | 1032051 A2 | 8/2000 |
| EP | 1744372 A2 | 1/2007 |
| EP | 1923920 | 5/2008 |
| FR | 2841703 A1 | 1/2004 |
| JP | 2216874 A | 2/1989 |
| JP | 2143468 A | 6/1990 |
| JP | 10189924 A | 7/1998 |
| JP | 11040835 | 12/1999 |
| JP | 2010-278132 | 12/2010 |
| JP | 2011-009684 | 1/2011 |
| WO | 93/14525 A1 | 7/1993 |
| WO | 2008/060509 A2 | 5/2008 |
| WO | 2008/076879 A1 | 6/2008 |
| WO | 2009/062178 A2 | 5/2009 |
| WO | 2009/137348 A2 | 11/2009 |
| WO | 2009/137352 | 11/2009 |
| WO | 2009/137353 | 11/2009 |

OTHER PUBLICATIONS

Japanese Office Action dated Feb. 3, 2015, Application No. 2014-501224.

Chinese Office Action dated Apr. 29, 2015 for Application No. 201280014482.5.

International Search Report dated Apr. 25, 2013 Application No. PCT/US2012/030028.

Translation of the Patent Office of the People's Republic of China Office Action dated Jan. 4, 2016, for Application No. 201280014482.5.

* cited by examiner

PHOTOVOLTAIC SHEATHING ELEMENT WITH A FLEXIBLE CONNECTOR ASSEMBLY

CLAIM OF PRIORITY

This application is a national phase filing under 35 USC §371 from PCT Application serial number PCT/US2012/030028 filed on 22 Mar. 2012, and claims priority therefrom. This application further claims priority from US Provisional Application 61/466,239 filed 22 Mar. 2011 both incorporated herein by reference in their entirety.

This invention was made with U.S. Government support under contract DE-FC36-07G017054 awarded by the Department of Energy. The U.S. Government has certain rights in this invention. This application claims priority from U.S. Provisional Application Ser. No. 61/466,239 filed Mar. 22, 2011, incorporated herein by reference.

FIELD OF THE INVENTION

The present invention relates to an improved photovoltaic roofing or building sheathing element capable of being affixed on a building structure, the roofing or building sheathing element including at least: a photovoltaic cell assembly in the form of a panel, a body portion attached to one or more portions of the photovoltaic cell assembly, at least a first and a second connector assembly disposed on opposing sides of the photovoltaic sheathing element, wherein at least one of which includes a flexible portion and is capable of directly or indirectly electrically connecting the photovoltaic cell assembly to one or more horizontally adjoining devices.

BACKGROUND

Efforts to improve PV devices, particularly those devices that are integrated into building structures (e.g. photovoltaic sheathing elements, spacer pieces, edge pieces), to be used successfully, should satisfy a number of criteria. The PV device and the array as installed should be durable (e.g. long lasting, sealed against moisture and other environmental conditions) and protected from mechanical abuse over the desired lifetime of the product, preferably at least 10 years, more preferably at least 25 years. The device should be easily installed into the array of devices (e.g. installation similar to conventional roofing shingles or exterior wall coverings) or replaced (e.g. if damaged). It also should be designed to prevent, as much as possible, water from getting under the device and to the building surface that the device is affixed to.

To make this full package desirable to the consumer, and to gain wide acceptance in the marketplace, the system should be inexpensive to build and install. This may help facilitate lower generated cost of energy, making PV technology more competitive relative to other means of generating electricity.

Existing art systems for PV devices may allow for the device to be directly mounted to the building structure or they may fasten the devices to battens, channels or "rails" ("stand-offs")) above the building exterior (e.g. roof deck or exterior cladding). These systems may be complicated, typically do not install like conventional cladding materials (e.g. roofing shingles or siding) and, as a consequence, may be expensive to install. Also, they may not be visually appealing as they do not look like conventional building materials. "Stand-offs" to mount PV device every 2-4 feet may be required. Thus, installation cost can be as much or more than the cost of the article. They also may suffer from issues related to environmental conditions such as warping, fading and degradation of its physical properties. In addition when a PV device in an array goes bad replacement can be difficult and costly. In those embodiments where the PV device is directly attached to a roof or building replacement of a bad PV device may require removal of several of the devices for replacement. This can result in very high replacement costs.

Among the literature that can pertain to this technology include the following patent documents: U.S. Pat. Nos. 5,590,494; 7,455,508; 5,990,414; 7,682,363, all incorporated herein by reference for all purposes.

SUMMARY OF THE INVENTION

The present invention is directed to a Photovoltaic (PV) device, and particularly to an improved photovoltaic sheathing element, for instance a photovoltaic shingle, that is affixed directly to a building structure (e.g. without the use of battens, channels or "rails" ("stand-offs")) above the building exterior) and used in an array of PV sheathing elements, and potentially other devices, that addresses at least one or more of the issues described in the above paragraphs. It is contemplated that the improved Sheathing Element includes at least a photovoltaic cell assembly; a body portion attached to one or more portions of the photovoltaic cell assembly; at least a first and a second connector assembly disposed on opposing sides of the sheathing element and capable of directly or indirectly electrically connecting the photovoltaic cell assembly to at least two adjoining devices that are affixed to the building structure and wherein at least one of the connector assemblies includes a flexible portion; one or more connector pockets disposed in the body portion at or within a defined distance of an outer edge of the body portion, the pockets capable of receiving at least a portion of the connector assembly.

DETAILED DESCRIPTION OF THE PREFERRED EMBODIMENT

Figure 1:
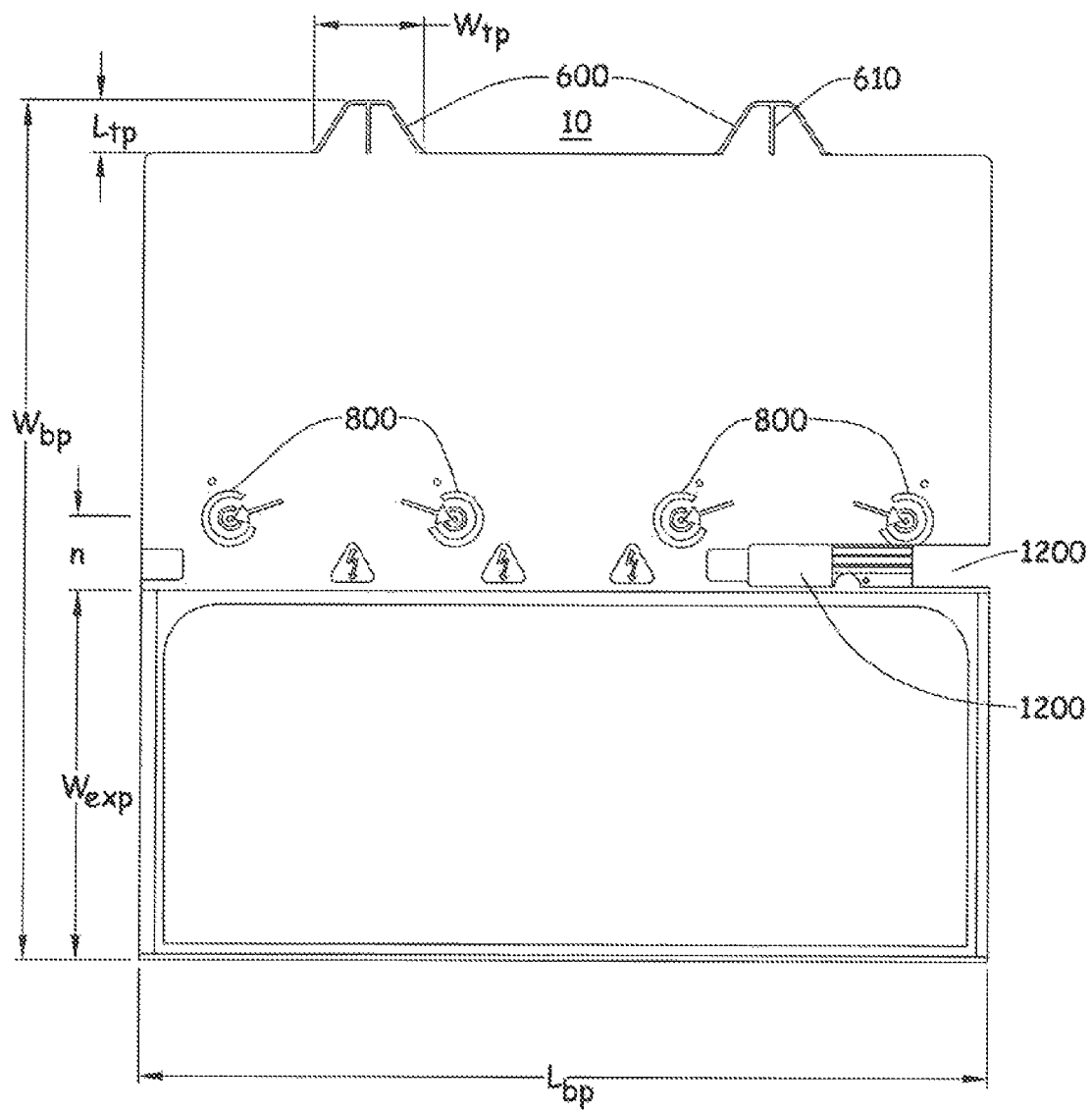
FIG. 1 is a plan view of an exemplary Sheathing Element according to the present invention.
Figure 8:
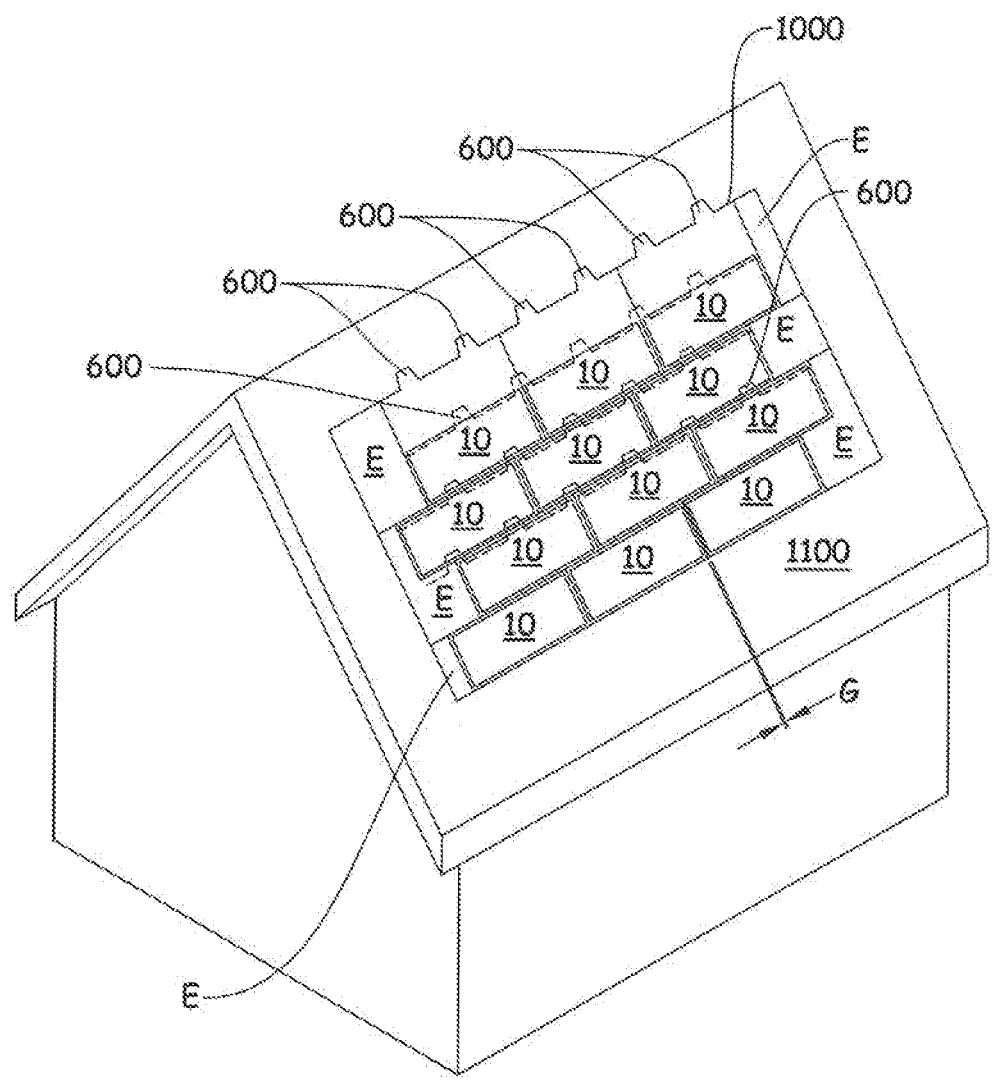
FIG. 8 is a perspective view of an exemplary array disposed on a building structure.

The present invention relates to an improved photovoltaic sheathing element, in a preferred embodiment a photovoltaic shingle, 10 (hereafter "PV Sheathing Element"), as illustrated in FIG. 1, can be described generally as an assembly of a number of components and component assemblies that functions to provide electrical energy when subjected to solar radiation (e.g. sunlight). Of particular interest and the main focus of the present disclosure is an improved PV Sheathing Element 10 that includes at least a photovoltaic cell assembly 100 joined to a body portion 200 that includes one or more connector assemblies 300 with a flexible portion. In a preferred embodiment, the PV Sheathing Element is formed by taking the photovoltaic cell assembly (and potentially other components and assemblies such as connector components) and forming (e.g. via injection molding) the body portion about at least portions of the photovoltaic cell assembly. It is contemplated that the relationships (e.g. at least the geometric properties and/or the material properties) between the components and component assemblies (of the PV Sheathing Element 10) and surrounding devices are surprisingly important in solving one or more of the issues discussed in the background section above. Of particular interest in this invention is where the PV Sheathing Element 10 is utilized for what is commonly known as Building-Integrated Photovoltaics, or BIPV and wherein the PV Sheathing Element 10 is connected to other devices (PV Sheathing Elements 10 or otherwise) to form an array 1000, for example an array 1000 as illustrated in FIG. 8. In essence an array is comprises a plurality of PV Sheathing Elements 10, wherein plurality means two or more. Each of the components and component assemblies and their relationships are disclosed in greater detail and specificity in the following paragraphs.

Accordingly, pursuant to a first aspect of the present invention, there is contemplated an assembly comprising: a photovoltaic sheathing, element capable of being affixed on a building structure, the sheathing element including at least: a photovoltaic cell assembly, a body portion attached to one or more portions of the photovoltaic cell assembly; at least a first and a second connector assembly disposed on opposing sides of the sheathing element and capable of directly or indirectly electrically connecting the photovoltaic cell assembly to at least two adjoining devices that are affixed to the building structure and wherein at least one of the connector assemblies includes a flexible portion; one or more connector pockets disposed in the body portion, the pockets capable of receiving at least a portion of the connector assembly The invention may be further characterized by one or any combination of the features described herein, such as a cover plate that as assembled protects one or more portions of the connector pocket, one or more portions of the connector assembly, or both; a sealing material disposed in or about the one or more connector pockets capable of protecting one or more portions of the connector assembly; the cover plate positions and maintains location of the electrical connector assembly; the first, the second connector assembly, or both are mechanically connected to the photovoltaic cell assembly; the first, the second connector assembly, or both are bonded to the photovoltaic cell assembly; the first, the second connector assembly, or both are a separate component comprising at least two opposing connector portions and interconnected by the flexible portion; and the photovoltaic sheathing element includes a connector mating component electrically connected to the photovoltaic cell assembly; wherein the at least one flexible connecting element is capable of bending such that the at least two opposing connector portions can move at least a distance equal to an interface length of either of the connector assemblies; disposed within the connector pocket is a bridging portion; the bridging portion including one or more of: a first feature capable of locating the connector assembly, securing the connector assembly, or both; a second feature capable of locating the cover plate, securing the cover plate, or both; a structural portion that connects the photovoltaic cell assembly to the body portion of the photovoltaic sheathing element; the one or more connector pockets disposed in the body portion are at least partially co-extensive with an outer edge of the body portion.

Accordingly, pursuant to a second aspect of the present invention, there is contemplated a method of installation, comprising the steps of: a: providing a first array device affixed to a building structure; b: providing a second array device affixed to the building structure, separated from the first device by a space; c: providing the assembly of the above first aspect of the present invention, the sheathing element having a lateral dimension less than the space; d: positioning the assembly of the above first aspect of the present invention into the space between the first and second array devices; e: connecting the first connector assembly to form an electrical connection to the first array device; and f: connecting the second connector assembly to form an electrical connection to the second array device.

The invention may be further characterized by one or any combination of the features described herein, such as further comprising the step of securing the sheathing element to the building structure, the securing step occurring between steps d and e, between steps e and f, after step f, or any combination thereof; one or more of the connecting steps include flexing the flexible portion of the connector assembly to facilitate engagement of the electrical connection; further comprising the steps of providing a cover plate and securing the cover plate to the replacement sheathing element; further comprising the steps of providing a sealing material and placing the sealing material into or about the connector pocket.

Accordingly, pursuant to a third aspect of the present invention, there is contemplated an photovoltaic sheathing element kit capable of being affixed on a building structure comprising: a photovoltaic sheathing element, the sheathing element including at least: a photovoltaic cell assembly, a body portion attached to one or more portions of the photovoltaic cell assembly; at least a first and a second connector assembly capable of directly or indirectly electrically connecting the photovoltaic cell assembly to one or more adjoining array devices that is affixed to the building structure and wherein at least one of the connector assemblies includes a flexible portion; a connector pocket disposed in the body portion capable of receiving the flexible portion of the connector assembly; and one or more bridging connectors 330 capable of mating with the first connector assembly, the second connector assembly, or both.

It should be appreciated that the above referenced aspects and examples are non-limiting, as others exist within the present invention, as shown and described herein.

Photovoltaic Cell Assembly 100

It is contemplated that the photovoltaic cell assembly 100 may be a compilation of numerous layers and components/assemblies, for example as disclosed in currently pending International patent application No. PCT/US09/042496, incorporated herein by reference. The photovoltaic cell assembly contains at least a barrier layer 122 and a photovoltaic cell layer 110 (generally located inboard of the peripheral edge of the barrier layer 122). It is contemplated that the photovoltaic cell assembly 100 may also contain other layers, such as encapsulant layers and other protective layers. Illustrative examples are shown in the figures and are discussed below. Exploded views of exemplary photovoltaic cell assemblies 100 are shown in FIGS. 2A and 2B. It is contemplated that the overall photovoltaic cell assembly 100 thickness $M_T$ may be about 1 to 12 mm, preferably about 2 to 9 mm, and most preferably less than about 9.0 mm.

Functionally, these encapsulant layers and other protective layers may include a number of distinct layers that each serve to protect and/or connect the photovoltaic cell assembly 100 together. Each preferred layer is described in further detail below, moving from the "top" (e.g. the layer most exposed to the elements) to the "bottom" (e.g. the layer most closely contacting the building or structure). In general each preferred layer or sheet may be a single layer or may itself comprise sub layers.

Barrier Layer 122

The barrier layer 122 may function as an environmental shield for the photovoltaic cell assembly 100 generally, and more particularly as an environmental shield for at least a portion of the photovoltaic cell layer 110. The barrier layer 122 is preferably constructed of a transparent or translucent material that allows light energy to pass through to the photoactive portion of the photovoltaic cell layer 110. This material may be flexible (e.g. a thin polymeric film, a multi-layer film, glass, or glass composite) or be rigid (e.g. a thick glass or Plexiglas such as polycarbonate). The material may also be characterized by being resistant to moisture/particle penetration or build up. The barrier layer 122 may also function to filter certain wavelengths of light such that unpreferred wavelengths may not reach the photovoltaic cells. In a preferred embodiment, the barrier layer 122 material will also range in thickness from about 0.05 mm to 10.0 mm, more preferably from about 0.1 mm to 4.0 mm, and most preferably from 2.5 mm to 3.5 mm. Other physical characteristics, at least in the case of a film, may include: a tensile strength of greater than 20 MPa (as measured by JIS K7127); tensile elongation of 1% or greater (as measured by JIS K7127); and/or a water absorption (23° C., 24 hours) of 0.05% or less (as measured per ASTM D570); and/or a coefficient of linear expansion ("CLTE") of about $5 \times 10^{-6}$ mm/mm° C. to $100 \times 10^{-6}$ mm/mm° C., more preferably of about $10 \times 10^{-6}$ mm/mm° C. to $80 \times 10^{-6}$ mm/mm° C., and most preferably from about $20 \times 10^{-6}$ mm/mm° C. to $50 \times 10^{-6}$ mm/mm° C. Other physical characteristics, at least in the case of a thick glass, may include: a coefficient of linear expansion ("CLTE") of about $5 \times 10^{-6}$ mm/mm° C. to about $140 \times 10^{-6}$ mm/mm° C., preferably of about $7 \times 10^{-6}$ mm/mm° C. to about $50 \times 10^{-6}$ mm/mm° C., more preferably from about $8 \times 10^{-6}$ mm/mm° C. to about $30 \times 10^{-6}$ mm/mm° C., and most preferably from about $9 \times 10^{-6}$ mm/mm° C. to about $15 \times 10^{-6}$ mm/mm° C. Other physical characteristics, at least in the case of a thick glass, may include: a density of about 2.42 g/cm³ to about 2.52 g/cm³, a tensile strength of between about 75 to 200 N/sq.mm, a compressive strength of between 500 and 1200 N/sq.mm, a modulus of elasticity of between 60-80 GPa, a CLTE of about $9 \times 10^{-6}$ mm/mm° C., and a visible light transmission of at least about 85%, preferably about at least 87%, more preferably at least about 90%.

First Encapsulant Layer 124

In one example of an encapsulant layer, a first encapsulant layer 124 may be disposed below the barrier layer 122 and generally above the photovoltaic cell layer 110. It is contemplated that the first encapsulant layer 124 may serve as a bonding mechanism, helping hold the adjacent layers together. It should also allow the transmission of a desirous amount and type of light energy to reach the photovoltaic cell 110. The first encapsulant layer 124 may also function to compensate for irregularities in geometry of the adjoining layers or translated through those layers (e.g. thickness changes). It also may serve to allow flexure and movement between layers due to temperature change and physical movement and bending. In a preferred embodiment, first encapsulant layer 124 may consist essentially of an adhesive film or mesh, preferably an EVA (ethylene-vinyl-acetate), thermoplastic polyolefin, polyurethanes, ionomers, silicon based polymers or similar material. The preferred thickness of this layer range from about 0.1 mm to 1.0 mm, more preferably from about 0.2 mm to 0.8 mm, and most preferably from about 0.25 mm to 0.5 mm.

Photovoltaic Cell Layer 110

The photovoltaic cell layer 110 contemplated in the present invention may be constructed of any number of known photovoltaic cells commercially available or may be selected from some future developed photovoltaic cells. These cells function to translate light energy into electricity. The photoactive portion of the photovoltaic cell is the material which converts light energy to electrical energy. Any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula CuIn(1-x)GaxSe(2-y)Sy where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These cells may be flexible or rigid and come in a variety of shapes and sizes, but generally are fragile and subject to environmental degradation. In a preferred embodiment, the photovoltaic cell assembly 110 is a cell that can bend without substantial cracking and/or without significant loss of functionality. Exemplary photovoltaic cells are taught and described in a number of US patents and publications, including U.S. Pat. Nos. 3,767,471, 4,465,575, US20050011550 A1, EP841706 A2, US20070256734 a1, EP1032051A2, JP2216874, JP2143468, and JP10189924a, incorporated hereto by reference for all purposes.

Figure 2:
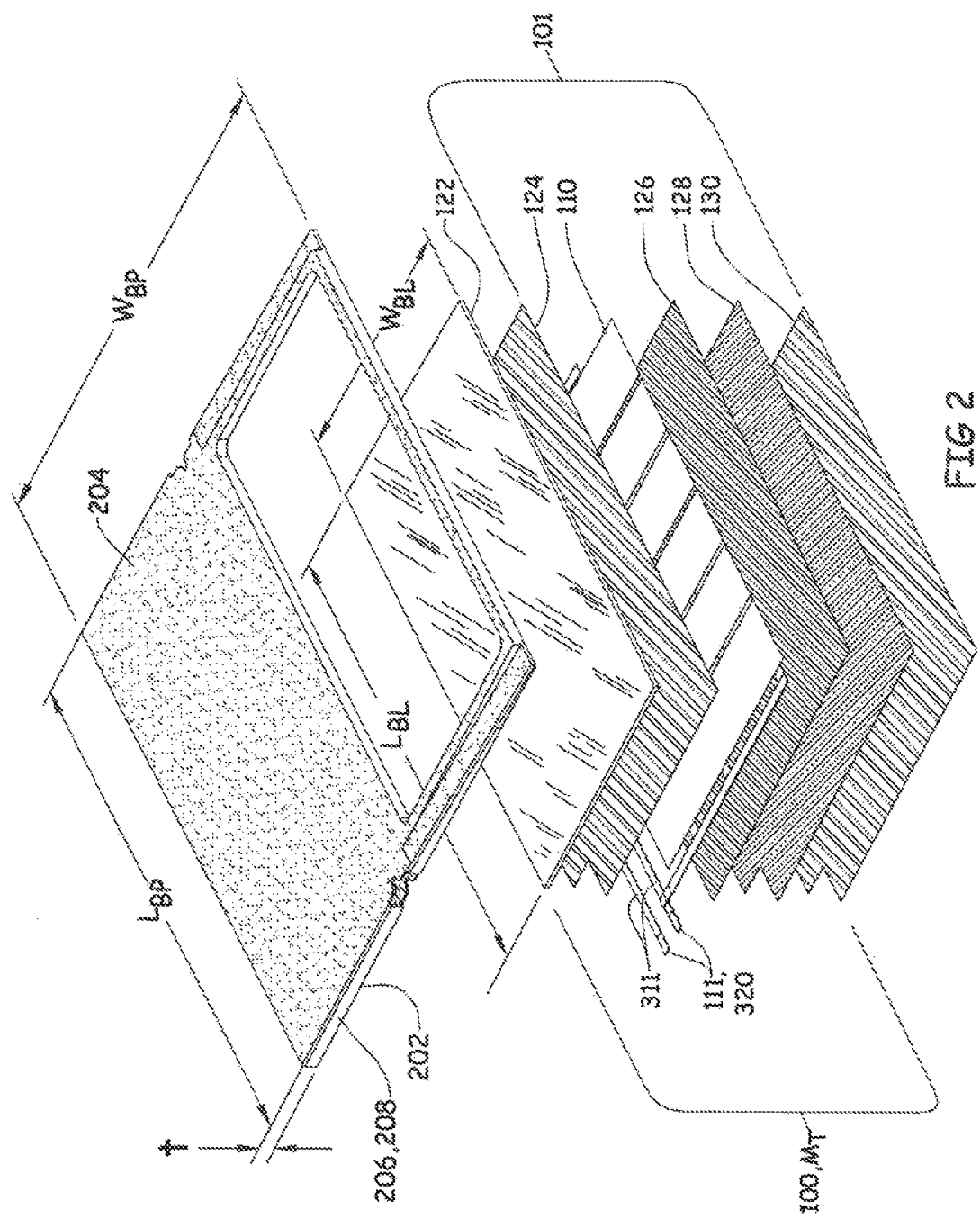
FIG. 2 is an exemplary exploded views of a Sheathing Element.

The photovoltaic cell layer 110, for example as illustrated in FIG. 2, may also include electrical circuitry, such as buss bar(s) 111 that are electrically connected to the cells, the connector assembly component(s) 300 and generally run from side to side of the PV Sheathing Element 10. This area may be known as the buss bar region 311.

Second Encapsulant Layer 126

In another example of an encapsulant layer, a second encapsulant layer 126 is generally connectively located below the photovoltaic cell layer 110, although in some instances, it may directly contact the top layer 122 and/or the first encapsulant layer 124. It is contemplated that the second encapsulant layer 126 may serve a similar function as the first encapsulant layer, although it does not necessarily need to transmit electromagnetic radiation or light energy.

Back Sheet 128

In an example of a protective layer there may be a back sheet 128 which is connectively located below the second encapsulant layer 126. The back sheet 128 may serve as an environmental protection layer (e.g. to keep out moisture and/or particulate matter from the layers above). It is preferably constructed of a flexible material (e.g. a thin polymeric film, a metal foil, a multi-layer film, or a rubber sheet). In a preferred embodiment, the back sheet 128 material may be moisture impermeable and also range in thickness from about 0.05 mm to 10.0 mm, more preferably from about 0.1 mm to 4.0 mm, and most preferably from about 0.2 mm to 0.8 mm. Other physical characteristics may include: elongation at break of about 20% or greater (as measured by ASTM D882); tensile strength of about 25 MPa or greater (as measured by ASTM D882); and tear strength of about 70 kN/m or greater (as measured with the Graves Method). Examples of preferred materials include: glass plate; aluminum foil; poly (vinyl fluoride) (for example, commercially available as Tedlar® (a trademark of DuPont)); poly(ethylene terephthalate); copolymer of tetrafluoroethylene and hexafluoroethylene (also known as "FEP"); poly(ethylene tetrafluoroethylene); poly(ethylene naphthalate); poly(methyl methacrylate); and polycarbonate, or a combination thereof.

Supplemental Barrier Sheet 130

In another example of a protective layer there may be a supplemental barrier sheet 130 which is connectively located below the back sheet 128. The supplemental barrier sheet 130 may act as a barrier, protecting the layers above from environmental conditions and from physical damage that may be caused by any features of the structure on which the PV Sheathing Element 10 is subjected to (e.g. For example, irregularities in a roof deck, protruding objects or the like). It is contemplated that this is an optional layer and may not be required. It is also contemplated that this layer may serve the same functions as the body portion 200 or cover plate 1300 including bridging and sealing functions discussed in relation to connector pocket 1200. In a preferred embodiment, the supplemental barrier sheet 130 material may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM D882); tensile strength or about 10 MPa or greater (as measured by ASTM D882); and tear strength of about 35 kN/m or greater (as measured with the Graves Method). Examples of preferred materials include thermoplastic polyolefin ("TPO"), thermoplastic elastomer, olefin block copolymers ("OBC"), natural rubbers, synthetic rubbers, polyvinyl chloride, and other elastomeric and plastomeric materials. Alternately the protective layer could be comprised of more rigid materials so as to provide additional roofing function under structural and environmental (e.g. wind) loadings. Additional rigidity may also be desirable so as to improve the coefficient of thermal expansion of the PV Sheathing Element 10 and maintain the desired dimensions during temperature fluctuations. Examples of protective layer materials for structural properties include polymeric materials such polyolefins, polyesters, polyamides, polyimides, polyester amides, polysulfone, acetal, acrylic, polyvinyl chloride, nylon, polycarbonate, phenolic, polyetheretherketone, polyethylene terephthalate, epoxies, including glass and mineral filled composites or any combination thereof.

The above described layers may be configured or stacked in a number of combinations, but it is preferred that the barrier layer 122 is the top layer. Additionally, it is contemplated that these layers may be integrally joined together via any number of methods, including but not limited to: adhesive joining; heat or vibration welding; over-molding; or mechanical fasteners.

For the sake of clarity in view of some of the embodiments discussed below, the photovoltaic cell assembly 100 can be further described in another fashion, as a two part assembly. The first part, the photovoltaic cell assembly subassembly 101, comprising all the layers of the photovoltaic cell assembly 100 (with the exception of the barrier layer 122) and the second part being the barrier layer 122. The barrier layer 122 may also be described as having a length "$L_{BL}$" and a width "$W_{BL}$", for example as labeled in FIG. 2. Preferably, the $L_{BL}$ ranges from about 0.75 to about 1.25 times that of the $L_{BP}$ discussed below, more preferably the lengths are within about 5-10% of each other. Also contemplated is that the photovoltaic cell assembly subassembly 101 may have an overall CLTE ("subassembly CLTE") that ranges from about 30×10–6 mm/mm° C. to 150×10–6 mm/mm° C., more preferably about 50×10–6 mm/mm° C. to 100×10–6 mm/mm° C.

Body Portion 200

It is contemplated that the body portion 200 may be a compilation of components/assemblies, but is preferably generally a polymeric article that is formed by injecting a polymer (or polymer blend) into a mold (with or without inserts such as the photovoltaic cell assembly 100 or the other component(s) (e.g. connector component)—discussed later in the application), for example as disclosed in currently pending International patent application No. PCT/US09/042496, incorporated herein by reference. The body portion 200 functions as the main structural carrier for the PV Sheathing Element 10 and should be constructed in a manner consistent with this function. For example, it can essentially function as a plastic framing material. It is contemplated that the body portion 200 should adhere to photovoltaic cell assembly 100 with an adhesion strength no less than the stress due to thermal expansion.

It is contemplated that the compositions that make up the body portion 200 also exhibit a coefficient of linear thermal expansion ("CLTE") of about 0.5×10–6 mm/mm° C. to about 140×10–6 mm/mm° C., preferably of about 3×10–6 mm/mm° C. to about 50×10–6 mm/mm° C., more preferably from about 5×10–6 mm/mm° C. to about 30×10–6 mm/mm° C., and most preferably from about 7×10–6 mm/mm° C. to about 15×10–6 mm/mm° C. Most desirably, the CLTE of the composition that makes up the body portion 200 should closely match the CLTE of the barrier layer 122. Preferably the CLTE of the composition making up the body portion 200 disclosed herein are also characterized by a coefficient of linear thermal expansion (CLTE) is within factor of 20, more preferably within a factor of 15, still more preferably within a factor of 10, even more preferably within a factor of 5, and most preferably within a factor of 2 of the CLTE of the barrier layer 122. Matching the CLTE's between the composition comprising the body portion 200 and the barrier layer 122 is important for minimizing thermally-induced stresses on the BIPV device during temperature changes, which can potentially result in cracking, breaking of PV cells, etc.

For some embodiments of the photovoltaic articles disclosed herein, the barrier layer 122 includes a glass barrier layer. If the barrier layer 122 includes a glass layer, the CLTE of the body portion is preferably less than $80 \times 10-6$ mm/mm° C., more preferably less than $70 \times 10-6$ mm/mm° C., still more preferably less than $50 \times 10-6$ mm/mm° C., and most preferably less than $30 \times 10-6$ mm/mm° C. Preferably, the CLTE of the body portion is greater than $5 \times 10-6$ mm/mm° C.

When glass is used (as the barrier layer 122), the compositions of the body material preferably have an elongation at break of at least 3% but not typically more than 200%. It is also contemplated, when glass is not used, that the body material preferably has an elongation at break of at least 100%, more preferably at least 200%, more preferably still at least 300% and preferably no more than 500%. The tensile elongation at break of compositions were determined by test method ASTM D638-08 (2008) @ 23° C. using a test speed of 50 mm/min.

In a preferred embodiment, the body support portion 200 may comprise (be substantially constructed from) a body material. This body material may be a filled or unfilled moldable plastic (e.g. polyolefins, acrylonitrile butadiene styrene (SAN), hydrogenated styrene butadiene rubbers, polyesters, polyamides, polyester amides, polyether imide, polyimides, polysulfone, acetal, acrylic, polyvinyl chloride, nylon, polyethylene terephthalate, polycarbonate, thermoplastic and thermoset polyurethanes, synthetic and natural rubbers, epoxies, SAN, Acrylic, polystyrene, or any combination thereof). Fillers (preferably up to about 50% by weight) may include one or more of the following: colorants, fire retardant (FR) or ignition resistant (IR) materials, reinforcing materials, such as glass or mineral fibers, surface modifiers. Plastic may also include anti-oxidants, release agents, blowing agents, and other common plastic additives. In a preferred embodiment, glass fiber filler is used. The glass fiber preferably has a fiber length (after molding) ranging from about 0.1 mm to about 2.5 mm with an average glass length ranging from about 0.7 mm to 1.2 mm.

In a preferred embodiment, the body material (composition(s)) has a melt flow rate of at least 5 g/10 minutes, more preferably at least 10 g/10 minutes. The melt flow rate is preferably less than 100 g/10 minutes, more preferably less than 50 g/10 minutes and most preferably less than 30 g/10 minutes. The melt flow rate of compositions were determined by test method ASTM D1238-04, "REV C Standard Test Method for Melt Flow Rates of Thermoplastics by Extrusion Plastometer", 2004 Condition L (230° C./2.16 Kg). Polypropylene resins used in this application also use this same test method and condition. The melt flow rate of polyethylene and ethylene—α-olefin copolymers in this invention are measured using Condition E (190° C12.16 Kg), commonly referred to as the melt index.

In all embodiments, the compositions have flexural modulus of at least 200 MPa, more preferably at least 400 MPa and most preferably at least 700 MPa. According to the preferred embodiment where the photovoltaic cell assembly 100 includes a glass layer, the flexural modulus is preferably at least 1000 and no greater than 7000 MPa. According to the second embodiment, the flexural modulus is no greater than 1500 MPa, more preferably no greater than 1200 MPa, most preferably no greater than 1000 MPa. The flexural modulus of compositions were determined by test method ASTM D790-07 (2007) using a test speed of 2 mm/min. It is contemplated that the compositions that make up the body portion 200 also exhibit a coefficient of linear thermal expansion ("body CLTE") of about $25 \times 10-6$ mm/mm° C. to $70 \times 10-6$ mm/mm° C., more preferably of about $27 \times 10-6$ mm/mm° C. to $60 \times 10-6$ mm/mm° C., and most preferably from about $30 \times 10-6$ mm/mm° C. to $40 \times 10-6$ mm/mm° C.

It is contemplated that the body portion 200 may be any number of shapes and sizes. For example, it may be square, rectangular, triangular, oval, circular or any combination thereof. The body portion 200 may also be described as having a length "$L_{BP}$" and a width "$W_{BP}$", for example as labeled in FIG. 2 and may be as little as 10 cm and as much as 500 cm or more, respectively. It may also have a thickness (t) that may range from as little as about 1 mm to as much as 20 mm or more and may vary in different area of the body portion 200. Preferably, the body portion 200 can be described as having a body lower surface portion 202, body upper surface portion 204 and a body side surface portion 206 spanning between the upper and lower surface portions and forming a body peripheral edge 208.

Connector Assembly 300

The connector assembly generally functions to allow for electrical communication to and/or from the PV Sheathing Element 10. This communication may be in conjunction with circuitry connected to the photovoltaic cell layer 110 or may just facilitate communication through and across the PV Sheathing Element 10 via other circuitry. The connector assembly may be constructed of various components and assemblies, and may be partially or fully integral to (embedded within) the PV Sheathing Element 10. It may also include both a rigid and flexible portions. The assembly 300 may or may not require the used with a separate component (e.g. see bridging connectors 330) to facilitate the electrical communication. Illustrative examples/embodiments of possible configurations are shown in the drawing figures and discussed in the subsequent paragraphs.

Preferably the connector assembly 300 comprises at least a polymer based housing 310 and electrical leads 320 protruding outward from the housing 310 and generally embedded in the PV Sheathing Element 10, although other configurations are contemplated. It is contemplated that the housing 310 can be adapted to either receive a mating connector or to be received into a mating connector, for example as shown in FIGS. 3A-D.

Polymer Housing 310

Figure 3A:
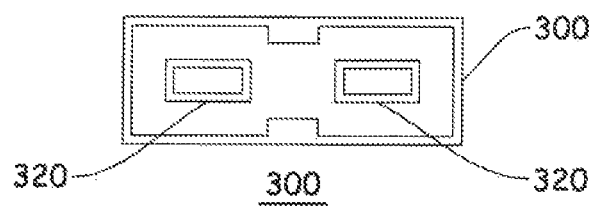
FIGS. 3A-D are views of exemplary connector housings.
Figure 3B:
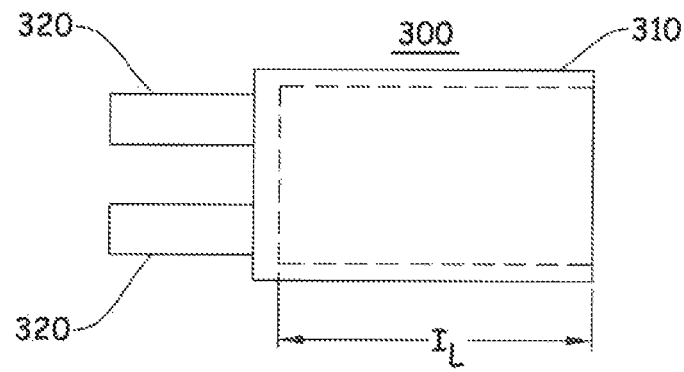
Figure 3C:
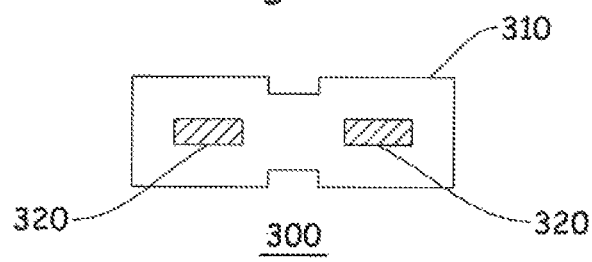
Figure 3D:
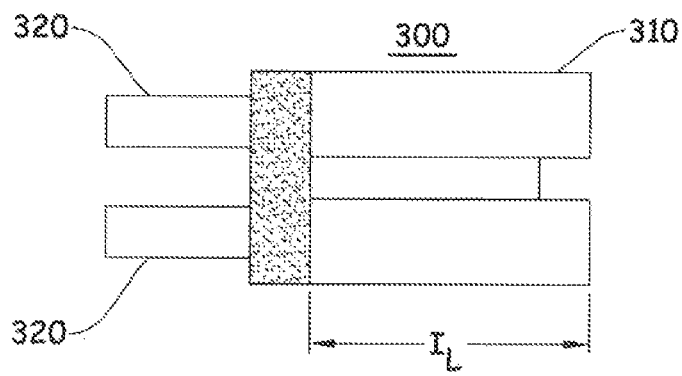

In a first example, an illustrative connector housing 310 as shown in FIGS. 3A and 3B. In this example, the housing is adapted to receive a mating connector (connector mating component), for example it may be configured to be used in conjunction with a bridging connector 330 to allow for electrical communication to and/or from the PV Sheathing Element 10. In a second example, an illustrative connector housing 310 as shown in FIGS. 3C and D, the housing is adapted to be received into a mating connector (connector mating component).

Examples of preferred materials that make up the housing 310 include: Polymeric compounds or blends of PBT (Polybutylene Terephthalate), PPO (Polypropylene Oxide), PPE (Polyphenylene ether), PPS (Polyphenylene sulfide), PA (Poly Amid) and PEI (polyether imide) and these can be with or without fillers of up to 65% by weight. It is contemplated that the compositions that make up the housing 310 also exhibit a coefficient of linear thermal expansion ("CLTE") in the flow direction of about $12 \times 10-6$ mm/mm° C. to $100 \times 10-6$ mm/mm° C., more preferably of about $15 \times 10-6$ mm/mm° C. to $80 \times 10-6$ mm/mm° C., and most preferably from about $20 \times 10-6$ mm/mm° C. to $60 \times 10-6$ mm/mm° C.

It is contemplated that the housing 310 may be constructed of any number of materials (as shown above), but preferably with material characteristics such as: a tensile modulus that is at least about 0.1 GPa, more preferably about 1 GPa, and most preferably about 10 GPa or more; ultimate elongation value of about 1 percent, more preferably about 1.5 percent, and most preferably about 2.5 percent or more; coefficient—of linear thermal expansion value of about 50×10−6 mm/mm° C., more preferably about 30×10−6 mm/mm° C., and most preferably about 20×10−6 mm/mm° C.

Electrical Leads 320

It is contemplated that the leads 320 may be constructed of any number of materials and geometric shapes, so long as they function to conduct electricity. They also may include both ridged and flexible portions. In the case where the connector assembly 300 is fully integral to (embedded within) the PV Sheathing Element 10, the lead 320 may not require the flexible portion. The embodiments wherein the leads 320 have a flexible portion are contemplated to be part of the present invention and are further detailed below.

Figure 4A:
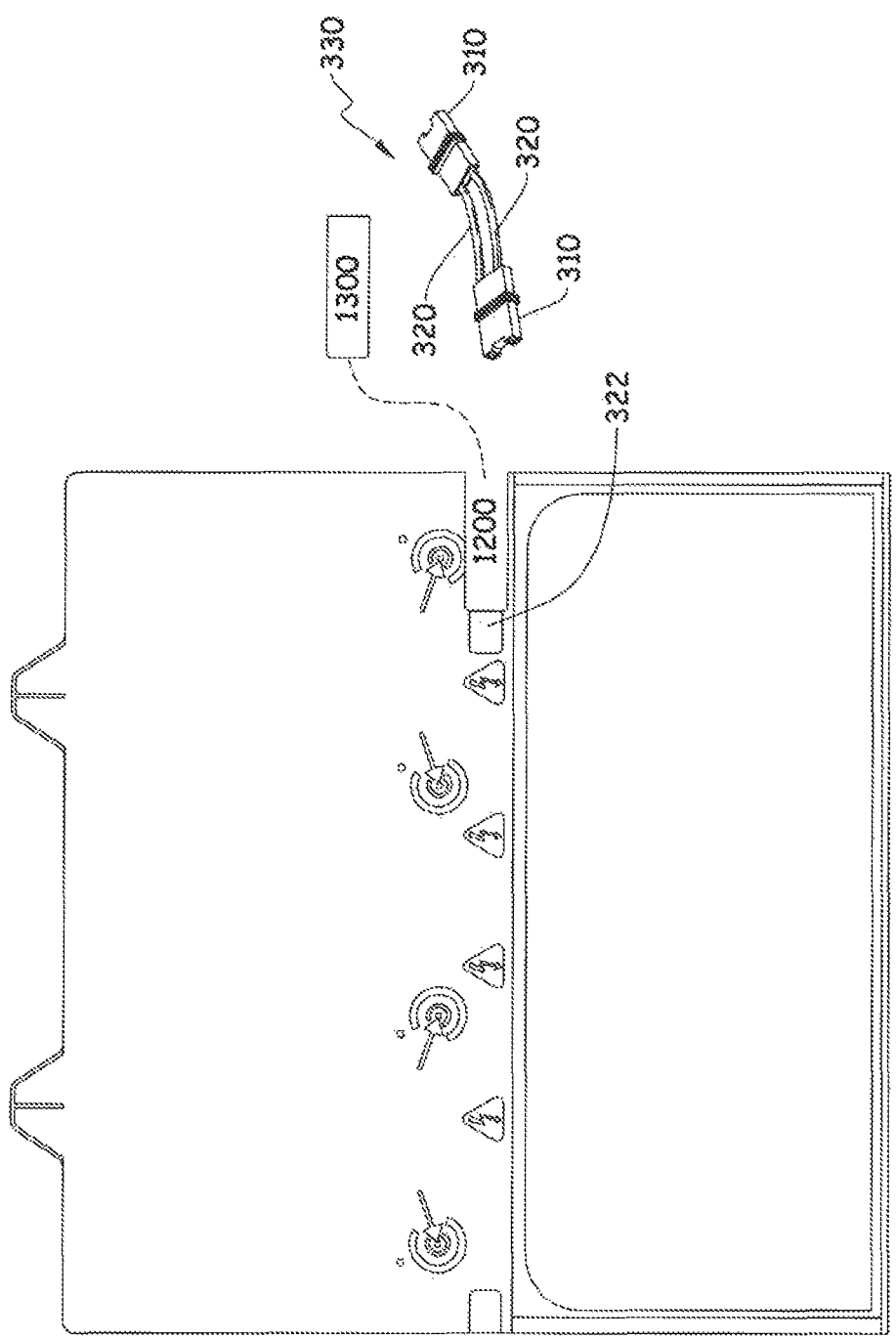
FIG. 4A is an exploded view of an example of an improved photovoltaic device and a flexible connector assembly.
Figure 4B:
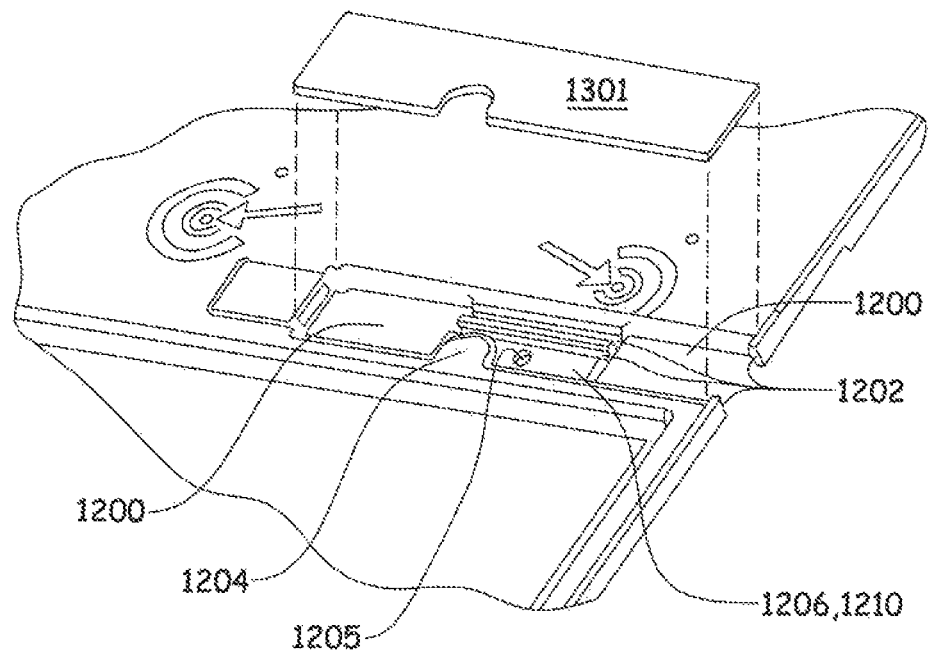
FIG. 4B-E are close up perspective views of examples of an improved photovoltaic device and flexible connector assemblies.
Figure 4C:
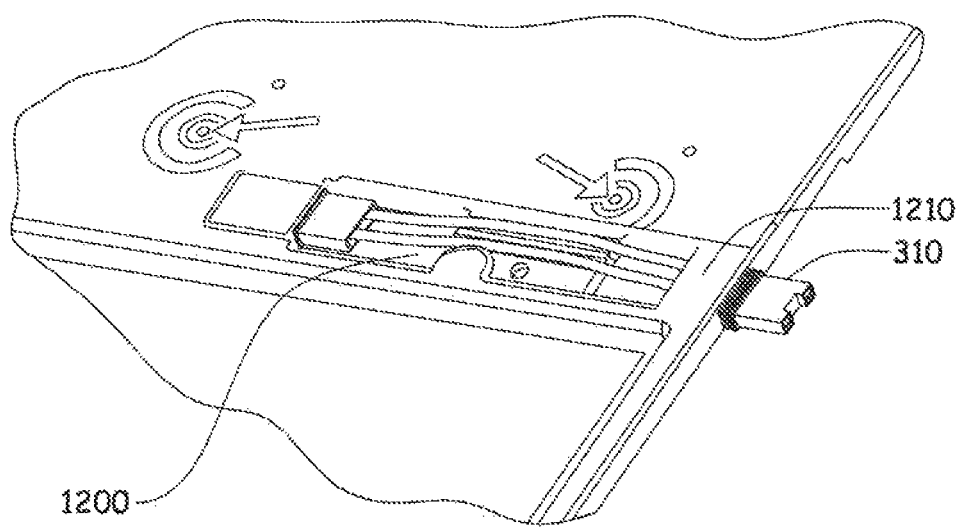
Figure 4D:
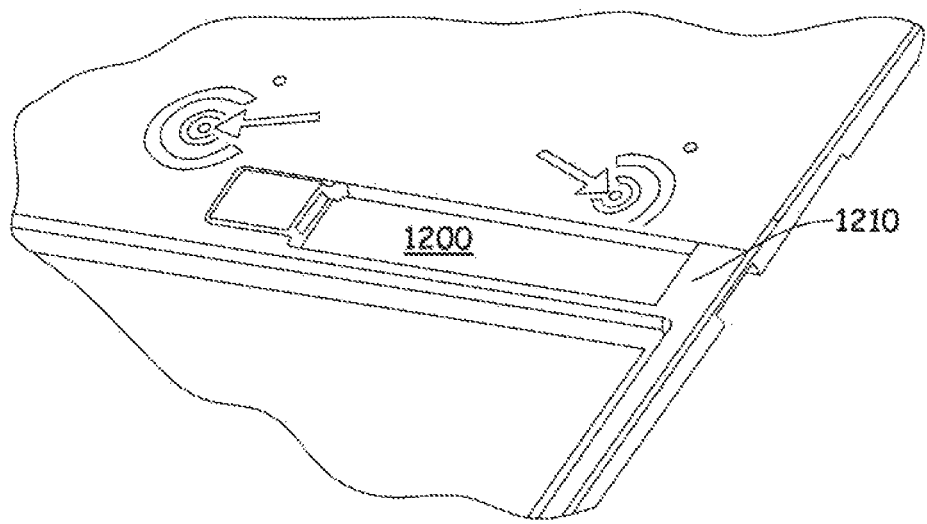
Figure 4E:
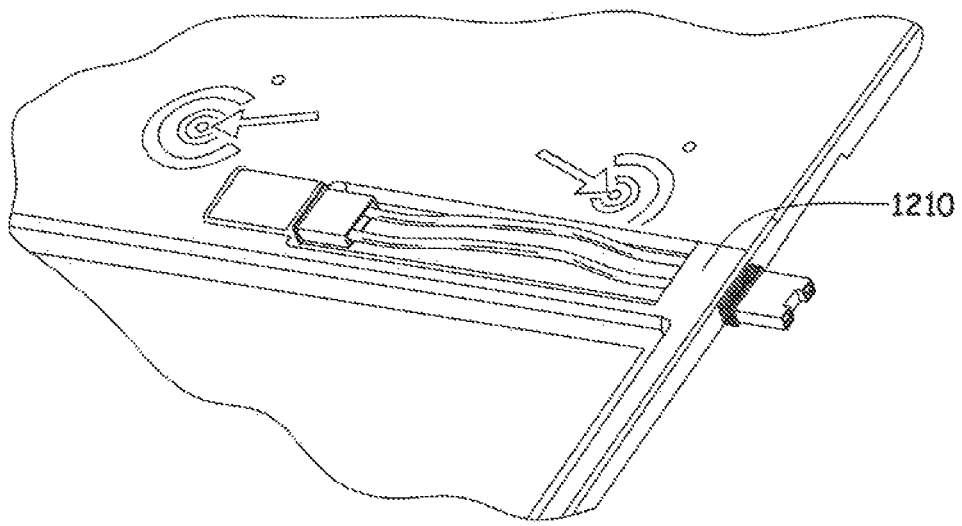
Figure 5:
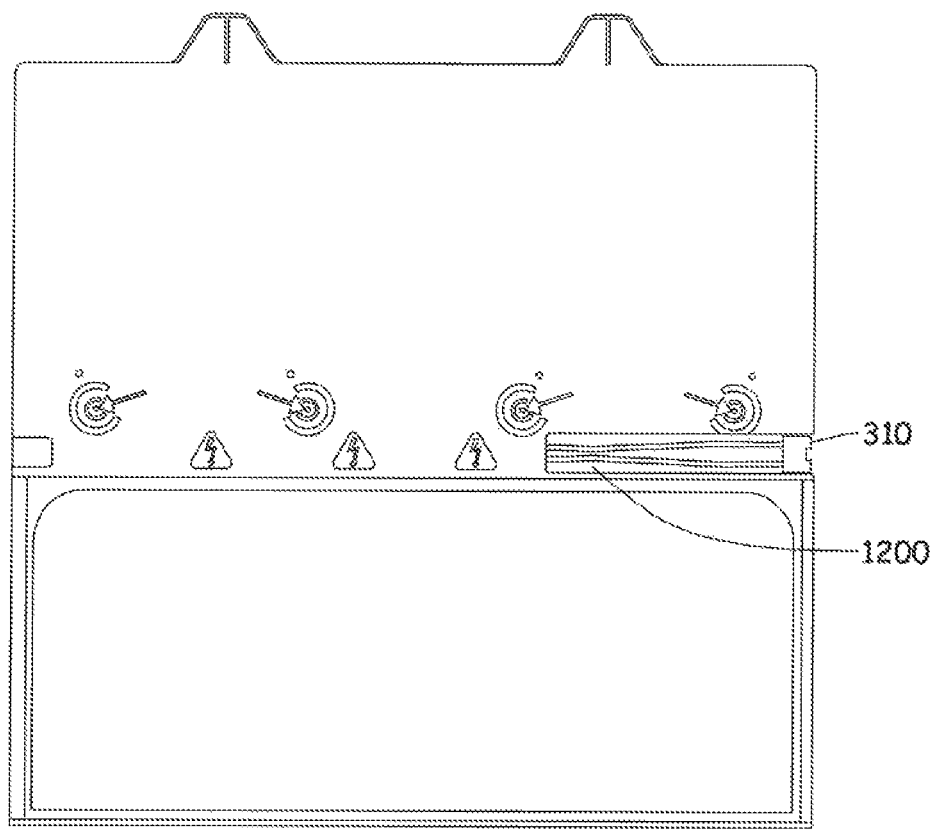
FIG. 5 is a view of another example of an improved photovoltaic device and a flexible connector assembly.

In a first illustrative embodiment, the leads 320 may be connected to the housing 310 on one end and connected to the PV Sheathing Element 10 in the opposing end (e.g. bonded to the photovoltaic cell assembly 110), for example as shown in FIGS. 4E and 5

In a second illustrative embodiment, the leads 320 may be connected to two separate housings 310 disposed on opposing ends, for example as shown in FIGS. 4A and 4C and then connected to the PV Sheathing Element 10 (e.g. mechanically attached to the photovoltaic cell assembly 110 with a connector mating component 322 or an integrated connector assembly 300).

As stated generally above, the leads 320 may include both ridged and flexible portions. At a minimum, the leads 320 should be able to flex a distance such that the flexible portion moves at least a distance equal to an interface length $I_L$ of the connector assemblies, thus allowing for the opposing connectors to engage and disengage and in a preferred embodiment, the leads 320 are constructed of wire strands, preferably coated or insulated wire.

Figure 6:
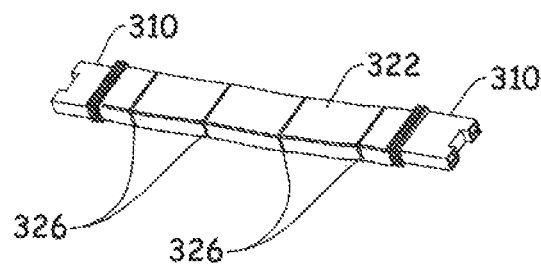
FIG. 6 is a perspective view of another flexible connector assembly example.

In another illustrative embodiment, as shown in FIG. 6, the leads are part of (preferably disposed within) a flexible connector module 322 that includes locally flexible joints 326. In this embodiment, the module 324 is connected to the PV Sheathing Element 10 via the connector mating component 322.

For the sake of clarity, "bonded" may include the use of process and structures such as, but not limited to, soldering, adhesives (conductive and otherwise), welding, and the like. "Mechanically attached" may include the use of process and structures such as, but not limited to, screws, clips, crimping, press-fitting, folding, twisting, and the like.

Connector Pocket 1200

It is contemplated that the PV Sheathing Element 10 may include one or more connector pockets, which function as a clearance area for receiving at least a portion of the connector assembly 300, specifically in the case of a connector assembly 300 with a flexible portion. The pocket 1200 may go completely through the Sheathing Element (e.g. a through-hole from the body lower surface portion 202 through the body upper surface portion 204), may, be a depression in the one or more portions 202, 204, or may be a combination of either. In a preferred embodiment, the pocket 1200 is a depression in the lower portion 202 and does not reach to the upper portion 204.

In one preferred embodiment, the connector pockets 1200 are disposed in the body portion at (co-extensive with) or within a distance from an outer edge of the body portion (e.g. body peripheral edge 208), for example as shown in FIGS. 1, 4A-E, and 5. This distance could be defined as % of $L_{bp}$, or more preferably as an absolute distance. If defined as a percentage of $L_{bp}$, then the percentage is about 15% or greater, more preferably about 7% or greater, most preferably about 0% (e.g. connector pocket is co-extensive with the outer edge), and the percentage is about 40% or less, more preferably about 30% or less and most preferably about 20% or less. Preferably, the distance may be defined in absolute terms. If defined in absolute terms, then the preferred distance is about 15.0 mm or greater, more preferably about 10.0 mm or greater, and most preferably is about 0.0 mm (e.g. co-extensive with the outer edge), and the distance is about 50.0 mm or less, more preferably about 40.0 mm or less, and most preferably about 20.0 mm or less. Additionally, it is preferred that the pocket include at least one location feature 1202 that is adapted to locate and/or secure the connector assembly 300, or a portion thereof, when installed. In one embodiment the location feature locates wires of the connector.

As one illustrative example, location features could include projections, for example as shown in FIG. 4B, the projection 1204 corresponds to a mating feature 1301 on cover plate 1300 and a hole 1205 corresponds to a locking feature, such as a retention pin, (not shown) on opposite surface of cover plate 1300.

As another illustrative example, as seen in FIGS. 4D-E, a portion of the pocket could be bridged about its open end with a strip 1210 such that the connector assembly fits under the strip. As yet another illustrative example, as seen in FIG. 4B-C, a strip or bridging portion 1210 is disposed within the connector pocket. The bridging portion 1210 may include one or more of: a first feature 1202 capable of locating the connector assembly 300, securing the connector assembly, or both; a second feature 1204 capable of locating a cover plate 1300, securing the cover plate 1300, or both; and a structural portion 1206 that connects the photovoltaic cell assembly to the body portion of the PV Sheathing Element 10.

Cover Plate 1300

It is contemplated that there may also be a cover plate 1300 that as assembled protects one or more portions of the connector pocket 1200, one or more portions of the connector assembly 300, or both. It is contemplated that the cover plate 1300 may also aid in the location and/or in the securing of the connector assembly 300. The cover plate 1300 may be constructed of various materials, but preferably has similar characteristics to the materials of the connector housing 310. If the pocket is disposed on the back side of the Sheathing Element 10 (e.g. against the building structure), the cover plate may not be required.

Sealing Material

It is contemplated that there may also be a sealing or displacing material disposed in or about the one or more connector pockets capable of protecting one or more portions of the connector assembly. It is possible that the sealing material may be applied by 1) potting of pocket, 2) as a gasket between cover and body, and 3) by sealing/potting sheet on TOP of cover and entire region. Materials suitable for use as a sealing material include: Thermoplastic elastomers such as copolymers of styrene, butadiene, isoprene, chloroprene; thermoplastic polyester copolymers (e.g., Hytrel from DuPont); poly ester amides; thermosets and thermosetting elastomers such as butyl rubber, silicones, polyurethanes, polyureas.

Bridging Connectors 330

Figure 7A:
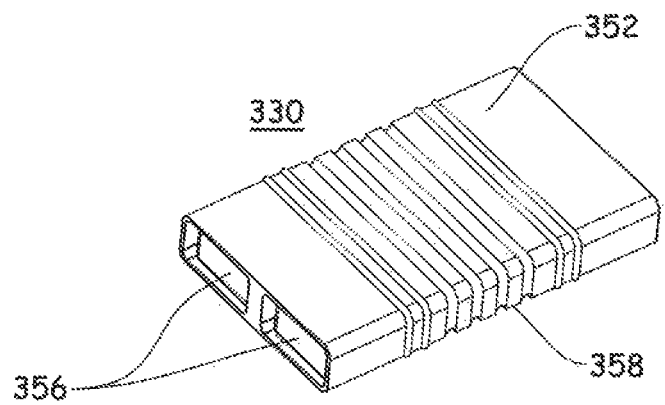
FIGS. 7A-C are views of an exemplary bridging connector and components thereof.
Figure 7B:
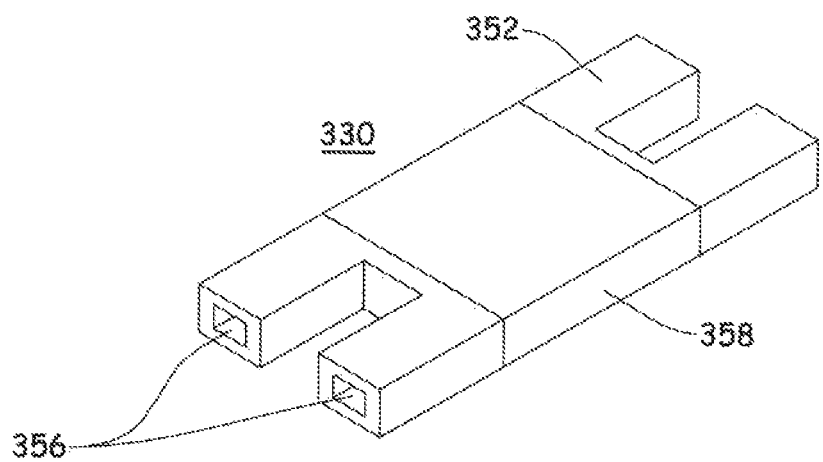
Figure 7C:
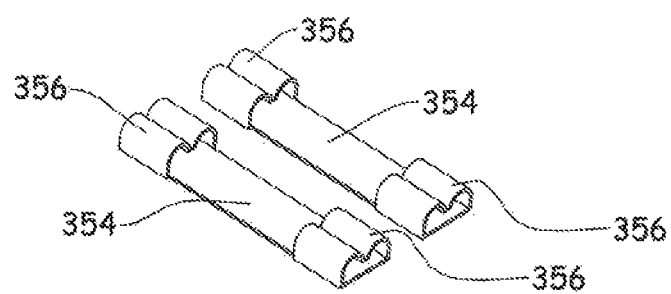

The bridging connectors 330 function as an interface component between devices that allow for electrical communication to and/or from the devices (e.g. between two PV Sheathing Elements 10, or between a PV Sheathing Element 10 and an edge piece "E", etc.). It is contemplated that the bridging connectors 330 may be a separable component from any of the devices, but is designed to specifically interface with the connector assembly 300. Examples of bridging connectors 330 are disclosed in PCT publication WO 2009/137347 A2 and are hereby incorporated by reference and illustrative examples are shown in FIGS. 7A-C. The present invention contemplates a kit of parts that may require one or more bridging connectors 330.

It is contemplated that the bridging connectors 330 are comprised of at least a bridge body portion 352 with two or more electrical conductive members 354 disposed within the body 352 and having terminals 356 at each end. Additionally, an outer gasket 358 may be disposed on the exterior of the body 352 which may aid in prevention of water intrusion between the bridging connector 330 and the connector assembly 300, when installed together.

Top Peripheral Tab 600

Figure 9:
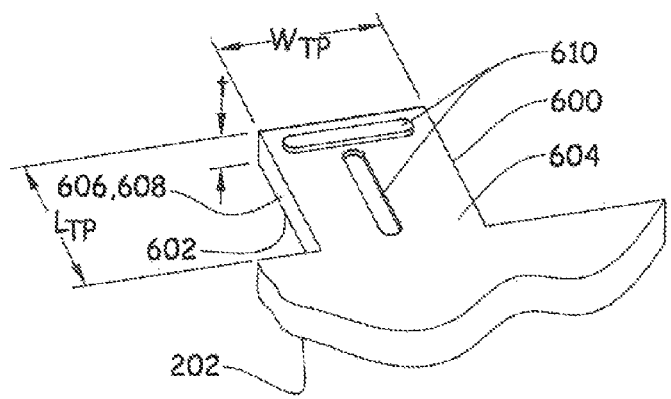
FIG. 9 is a perspective view of a tab with exemplary fluid directing features.
Figure 10A:
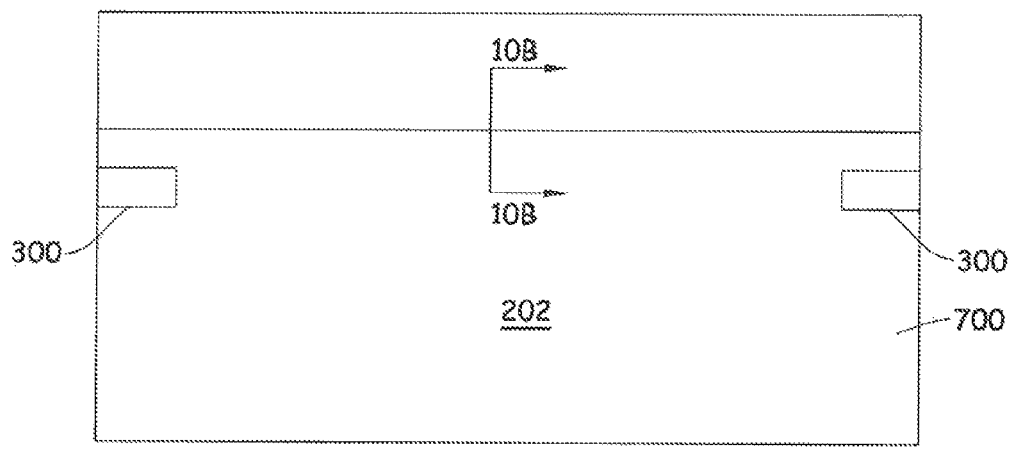
FIG. 10A is a plan view of the underside of an example of an improved photovoltaic device according to the present invention.
Figure 10B:
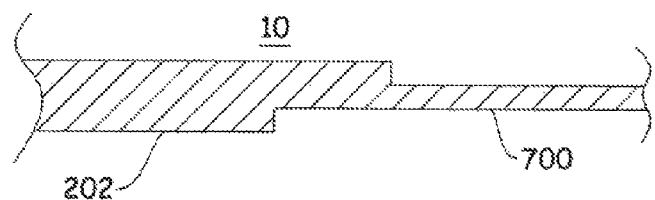
FIG. 10B is a side view of a section of FIG. 10A.
Figure 11A:
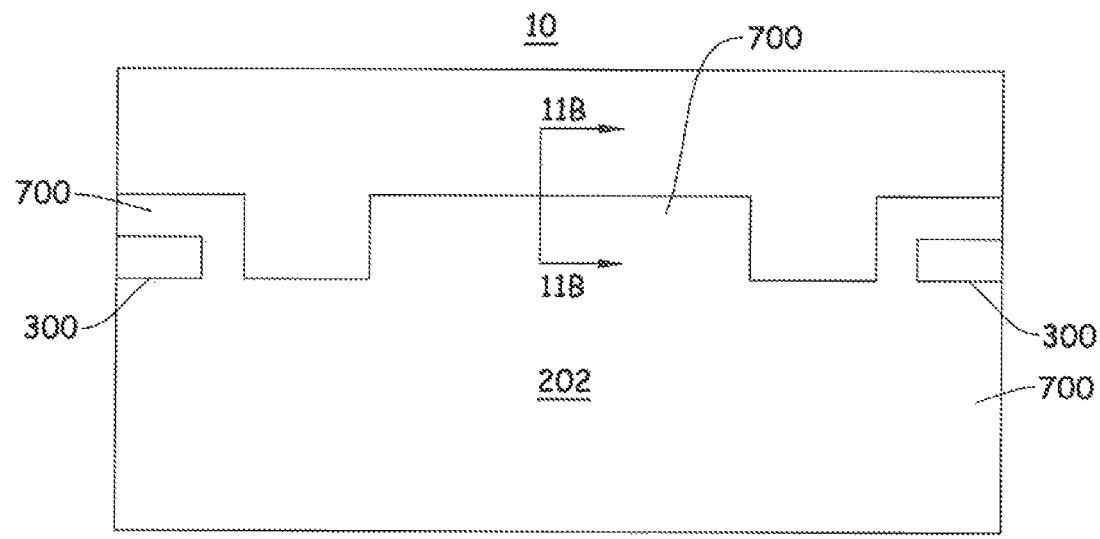
FIG. 11A is a plan view of the underside of another example of an improved photovoltaic device according to the present invention.
Figure 11B:
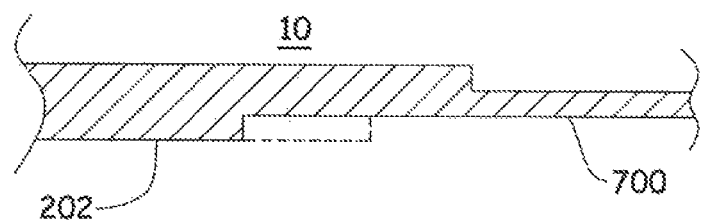
FIG. 11B is a side view of a section of FIG. 11A.
Figure 12:
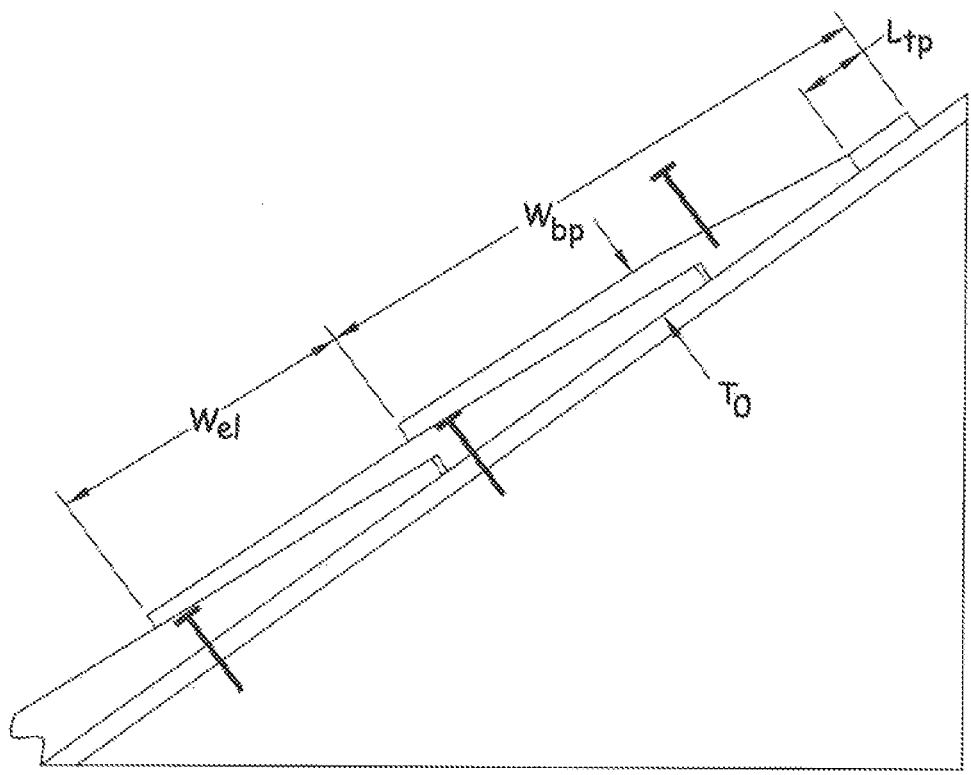
FIG. 12 is a side view of an exemplary array showing rise and run on a building structure.

A top peripheral tab 600 may be generally defined as a localized extension of the body section 200. It may functionally perform one or more of the following: aid in the vertical positioning of adjacent devices; aid in the horizontal positioning of adjacent devices; and provide additional protection against water intrusion (e.g. water getting under the PV Sheathing Element 10), for example potentially in and around the area of the connector assembly 300 or in an area where two adjacent devices meet (see gap "G"). In a preferred embodiment, the PV Sheathing Element 10 has two or more tabs 600 disposed along a top edge of the Sheathing Element 10 The tabs may be of any shape that performs the recited function. It is contemplated that the peripheral tab 600 may be any number of shapes and sizes. For example, it may be square, rectangular, triangular, oval, circular or any combination thereof. Preferably the tabs are generally square or rectangular in shape. The peripheral tab 600 may also be described as having a length "$L_{TP}$", a width "$W_{TP}$", and a thickness "t", for example as labeled in FIG. 9. Illustrative examples are shown in FIGS. 1 and 9. The tabs 600 are preferably integral to the body portion 200 and have a thickness small enough so that they are capable of fitting under one or more vertically adjoining devices (whether the device does or does not have a receiving zone 700 therein). Furthermore, it is also preferred that the tabs 600 are disposed along the top edge of the PV Sheathing Element in a position such that when placed in an array 1000, at least one tab 600 is adapted to fit under at least two vertically adjoining devices in an area where an electrical connector 300 is present or in an area where two adjacent devices meet (see gap "G"). An illustrative example may be seen in FIG. 8, referring to tab 600 between the spacer piece "S" and the PV device 10 and tab 600 between the spacer piece "S" and the edge piece "E". The location of the tabs 600 under vertically adjacent photovoltaic sheathing elements 10 are shown using dotted lines in FIG. 8. It is also preferred that the tabs 600 are disposed in a position such that when placed in an array 1000, the tabs 600 do not fall directly below the fixation area 800 of the immediately vertically adjacent device. It may be desirable that any fastener used to secure the immediately vertically adjacent device that is sitting on top of the tab 600 not be allowed to go through the tab 600 or through a vertically adjacent device. Another way of defining this is to state that it is preferred that the tab 600 is located such that the fastener is going only through one device and then the structure 1100, the fastener doesn't go through two devices.

It is contemplated that the peripheral tab 600 may be any number of shapes and sizes. For example, it may be square, rectangular, triangular, oval, circular or any combination thereof. The peripheral tab 600 may also be described as having a length "$L_{TP}$", a width "$W_{TP}$", and a thickness "t", for example as labeled in FIG. 9.

It is contemplated that the length may be about 10 mm or greater, but preferably about 15 mm or greater, more preferably about 20 mm or greater, and preferably about 100 mm or less, more preferably about 80 mm or less, and most preferably about 60 mm or less. In most cases, it is believed that the tab length of about 35 mm will perform. Looking at FIGS. 1 and 10A through 12, it can be seen that the length $L_{tp}$ may also be defined by combining calculations for overlap, nail position, device thickness and various factors for compensating for installation tolerance, materials of construction, environment, and other weather related properties. The minimum length for avoidance of overlapping with respect to nail penetrations may be defined by the formula $L_{tpn} = W_{bp} - (2 * W_{exp}) - n + C1 * (L_{bp}/W_{exp})$ where C1 is a constant from about 0 to 2, or any subset between about 0 and 2, but more preferably about 0.05 to 1.2, most preferably about 0.1 to 0.6. Additional tab height may be required as the device thickness increases at the overlap portion. This is specifically of value as the thickness increases as is in the case of photovoltaic products that are intended to integrate with the building and provide the roofing function. Again, referring to FIGS. 6A through 9, this additional length may be defined as $L_{tpt} = C2 * T_o * (1/\text{roof pitch})$, where C2 is a constant between about 0.5 and 3, or any subset between about 0.5 and 3, but more preferably about 0.7 to 2, and most preferably between about 0.8 and 1.5, and $T_o$ is the device thickness at the overlap location, and roof pitch=rise/run. These equations may be combined to determine the total length for the tab, where $L_{tp} = L_{tpn} + L_{tpt}$. Where $L_{tp} = (W_{bp} - (2 * W_{exp}) - n + C1 * (L_{bp}/W_{exp})) + (C2 * T_o * (1/\text{roof pitch}))$.

It is contemplated that the tab width may be about 15 mm or greater, but preferably about 30 mm or greater, more preferably about 40 mm or greater, and most preferably about 50 mm or greater, and preferably about 200 mm or less, more preferably about 150 mm or less, and most preferably about 120 mm or less. It is also contemplated that the tab 600 could be up to the full width of Sheathing Element, but preferably would have at least local cut outs in the areas of the fixation area 800 that allow for fasteners to go through unimpeded.

It may also have a thickness (t) that may range from about 0.5 mm to 20.0 mm, preferably about 0.5 mm or greater, more preferably about 1.0 mm or greater and most preferably about 2.0 mm or greater, and preferably about 20.0 mm or less, more preferably about 15.0 mm or less and most preferably about 10.0 mm or less. It is contemplated that the thickness may vary in different area of the peripheral tab 600 (e.g. see fluid directing features below where it can be locally thicker or thinner).

The peripheral tab 600 can also be described as having a peripheral tab lower surface portion 602, peripheral tab upper surface portion 604 and a peripheral tab side surface portion 606 spanning between the upper and lower surface portions and forming a body peripheral edge 608.

In one preferred embodiment, the tab 600 will include fluid directing features 610. These features may aid in the channeling of water away from the edge of the PV Sheathing Element 10 and help prevent the water from reaching the underside of the Sheathing Element 10 (e.g. body lower surface portion 202). Contemplated fluid directing features 610 may include geometric shapes disposed in/on the otherwise planer surface of the tab 600, such as valleys or projections in, for example as seen in FIG. 9. Other contemplated features 610 may include the addition of compressible materials to the surface of the tab 600, such as gasket materials, elastomers, caulk, or similar sealing materials. It is contemplated that any or all of the fluid directing features 610 may not be limited to only the area of the tab 600, but may continue into the main portion of the body 200.

Receiving Zone 700

A receiving zone 700 functions as a clearance area for the peripheral tabs 600 of an adjoining device. It is where, at least locally, the PV Sheathing Element 10 or other device, has a thickness that is capable of receiving the one or more peripheral tabs and not causing the PV Sheathing Element 10 or other device to be bent or otherwise distorted when affixed to the building structure. Typically, the receiving zone may be disposed on an underside of the PV Sheathing Element or other device. Two illustrative examples are shown in FIGS. 10A through 11B, wherein a continuous receiving zone 700 and separate receiving zones 700 are presented. In the case of the continuous receiving zone 700, the combination of the tabs 600 and zone 700 may help with vertical positioning of the devices in the vertically adjacent row. In the case of a device with separate receiving zones 700, the combination of the tabs 600 and zone 700 may help with both the vertical and horizontal positioning of the devices in the vertically adjacent row. Preferably the dimensions of the zones 700 (length and/or width) are larger than that of the tabs 600. In a preferred embodiment, the dimensions of the zone 700 are about 2 percent larger or greater than the tabs 600, more preferably about 5 percent larger or greater, most preferably about 7 percent larger or greater, and preferably about 25 percent larger or less, more preferably about 15 percent larger or less and most preferably about 10 percent larger or less.

Fixation Area 800

A fixation area 800 is an area of the PV Sheathing Element 10 where it is desirable through which to secure (e.g. via fasteners such as nails, screws, clips, etc.) the Sheathing Element 10 to the building structure. The area 800 is preferably positively identified on the PV Sheathing Element 10 such that an installer may easily ascertain the proper area in which to drive the nail, screw, or other fasteners. As shown in FIG. 1, in one illustrative example, a plurality of semi-circles and text identify the preferred fixation area 800.

Geometric Features 250

It is contemplated that the body portion 200 may also include one or more geometric features 250. These features 250 may function to prevent vertically adjoining Sheathing Elements 10 from sliding relative to each other prior to final attachment, for example preventing, the PV Sheathing Element 10 from falling off the roof during installation. It is contemplated that these features 250 should have the above stated function, while at the same time not interfering with the basic function of the Sheathing Element 10 or with the ability of the installer to easily install the Sheathing Elements 10 into the array 1000. It is contemplated that the geometric features protrude from the body lower surface portion 202, body upper surface portion 204, or both. It is also desirable that the features not interfere with the Sheathing Elements 10 ability to lay relatively flat when fastened to a structure. It is preferred that whatever combination of features 250 are utilized, the features are capable of being "flattened out" or made not to effect the above mention functions. It is even more preferred that the force required to "flatten out" the features 250 be at least greater than the force exerted by the mass of the Sheathing Element 10 if laid on a flat surface and no more than a force required to install the Sheathing. Element 10. In one exemplary embodiment, the force required to "flatten out" the features 250 may be as low as about 5 Newtons ("N") and as high as about 200 Newtons. In a preferred embodiment, the force is greater that about 5N, more preferably is greater than about 7N, even more preferably greater than about 10N, and preferably less than about 200N, more preferably less than about 100N and most preferably less than about 50N.

It is contemplated that the features 250 may be disposed on the body lower surface portion 202, body upper surface portion 204, or both. It is also contemplated that the features 250 may include localized areas that are weakened so that a natural hinge point is created. This may be accomplished in any number of ways, which form a natural hinge point, including but not limited to, thinned out cross sections at or near the base of the feature. Below, a few illustrative examples and preferred embodiments are described in further detail.

Figure 13A:
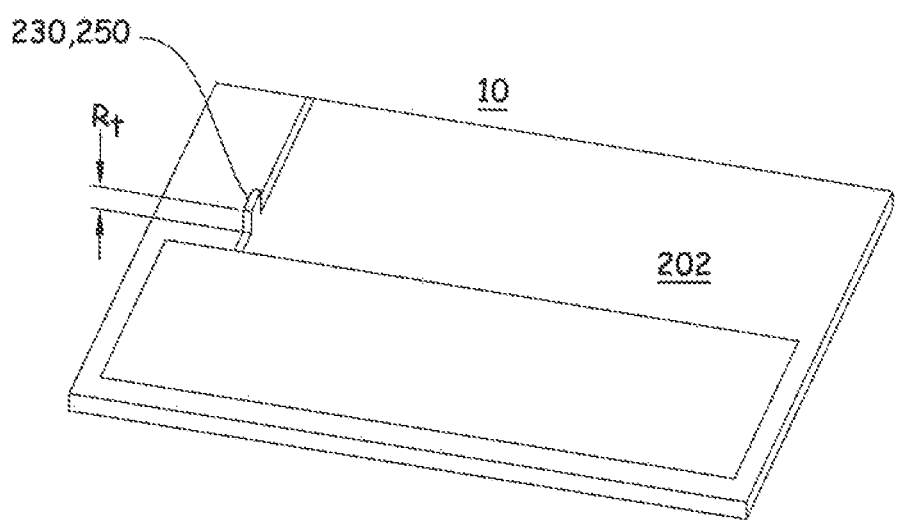
FIGS. 13A-C are exemplary views of one embodiment of geometric features according to the present invention.
Figure 13B:
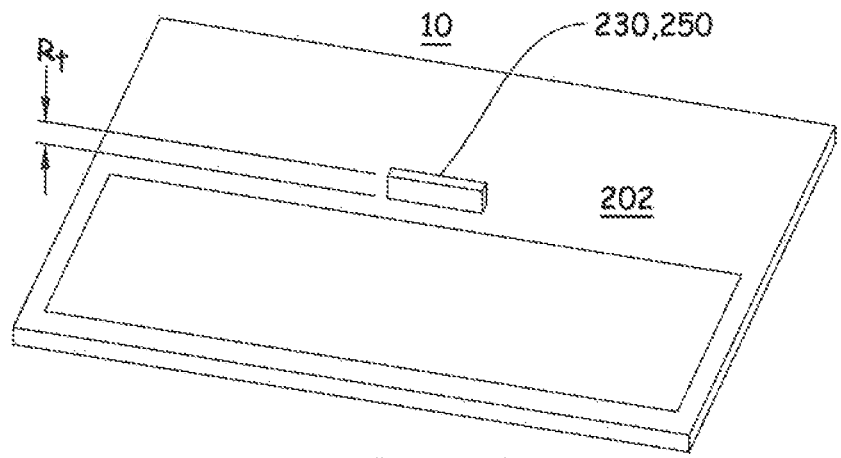
Figure 13C:
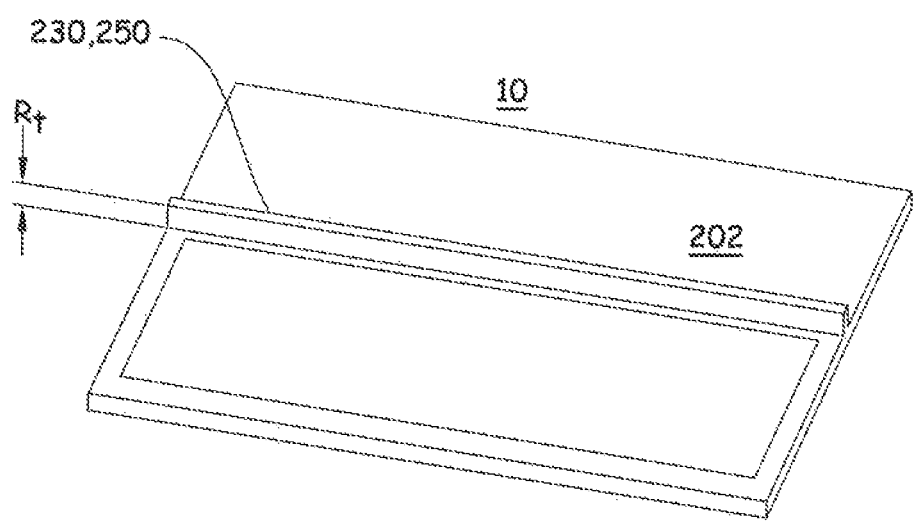

In a first embodiment, the feature 250 is located on the body lower surface portion 202. It is contemplated that this feature is in the form of one or more extended ledge ribs 230. The rib 230 may be located on body lower surface portion 202 and is capable of engaging a top peripheral edge (e.g. the body peripheral edge 208) of vertically adjoining device, for example as illustrated in FIGS. 13A-C. It is contemplated that the tab may run fore-aft on the Sheathing Element (e.g. FIG. 13A) or across the Sheathing Element 10 (e.g. FIGS. 13B-C). In one preferred embodiment, the rib 230 is at least about 10 mm in length ($R_T$) and is no longer than about 35 mm. In another preferred embodiment, the rib 230 spans substantially across the Sheathing Element 10. It is contemplated that if the rib is too long or too short, it may not conform to the force criteria discussed above or may not engage the top peripheral edge of vertically adjoining device properly.

In a second embodiment, the feature 250 is located on one or more top peripheral tabs 600. Generally, a top peripheral tab 600 may be generally defined as a localized extension of the body section 200, for example as shown in FIG. 1.

Figure 14A:
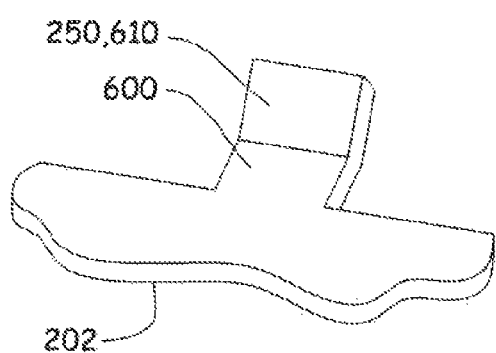
FIGS. 14A-D are exemplary views of another embodiment of geometric features according to the present invention.
Figure 14B:
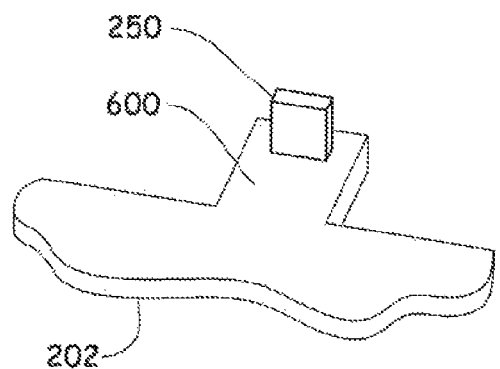
Figure 14C:
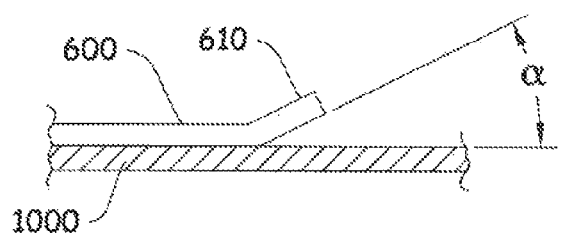
Figure 14D:
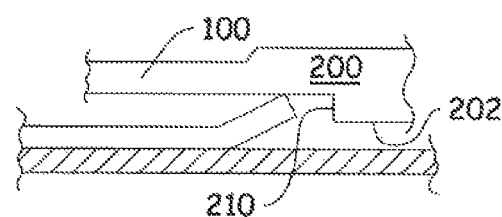

In one illustrative example, the tab 600 itself may be the feature 250, for example as shown in FIGS. 14A, 14C and 14D. In another illustrative example, the tab 600 provides a base for the feature 250, for example as shown in FIG. 14B. FIG. 13A shows a photovoltaic sheathing element 10, having geometric feature 250 in the form of a protrusion 230 located on the body lower surface portion 202 of the photovoltaic sheathing element 10. FIG. 13B shows geometric feature 250 in the form of a protrusion 230 disposed on the body lower surface portion 202 of the photovoltaic sheathing element 10. The protrusion rib length (Rt) of the protrusion is illustrated. FIG. 13C shows a photovoltaic sheathing element 10, having geometric feature 250 in the form of a protrusion 230 which spans the width of the photovoltaic sheathing element, to in essence from a protruding rib, located on the body lower surface portion 202 of the photovoltaic sheathing element 10.

In a preferred embodiment related to the first illustrative example, the tab 600 itself constitutes the feature 250 and the tabs including an upwardly extending portion 610. Even more preferably, the upwardly extending portion 610 begins at least 10 mm from a distal end of tabs 600 and has an angle a of preferably about. 80° or less, more preferably about 60° or less, more preferably about 50° or less, and preferably about 5° or greater, more preferably about 10° or less relative to a plane defined by a mounting surface of the building structure, as shown in FIG. 14C. For example, this angle could be very small. For example, 10mm distance can be achieved in a 60 mm tab with an angle a of 9.5 degrees. In this embodiment, it is contemplated that the feature 250 is capable of engaging a vertically adjacent device (e.g. Sheathing Element 10) at the transition portion 210, for example as shown in FIG. 14D.

Pre-bend

Figure 15:
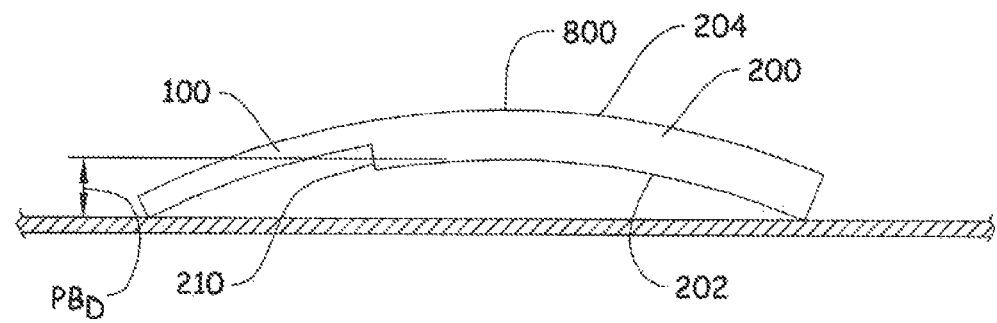
FIG. 15 is a side view of an exemplary Sheathing Element, showing the pre-bend.

It is contemplated that the Sheathing Element 10 may have a pre-bend or "cant" formed into the structure, as illustrated in FIG. 15. It is believed that having a pre-bend in the Sheathing Element may provide better environmental stability for the part when installed on the building structure 1100 (e.g. resistance to wind uplift) as well as possibly other issues described previously in the application. The pre-bend of the Sheathing Element 10 is preferably arcuate in shape and may be substantially removed (e.g. flattened out) when installed on the building structure. It is preferred that no matter how much pre-bend exists in the Sheathing Element 10, the force required to remove bend is consistent with nailing or screwing or other attachment means (e.g. clips) or to say bend is substantially reduced or removed as installed and according to one embodiment the bend is preferably removed in the non-PV cell portion or non-active portion. In other words, it is preferred that the pre-bend exists for the most part in the area of the Sheathing Element 10 that would not suffer damage if it were bent. The apex can be located anywhere along the PV sheathing element so that the PV sheathing element remains on the structure unit being affixed to the structure. In one embodiment, the prebend is designed such that prior to affixing the PV sheathing element to the structure the concave surface of the photovoltaic sheathing element faces the surface of the structure it is to be affixed to. For simplicity, the pre-bend may be further defined as a vertical bend distance ($PB_D$) between a flat surface and the bottom of the Sheathing Element 10 at the fixation area 800. In a preferred embodiment, the amount of pre-bend (vertical bend distance ($PB_D$)) may range from about a minimum of about 3 mm to a maximum of about 35 mm. In a preferred embodiment, the vertical bend distance is about 3 mm or greater, more preferably at least about 6 mm or greater, and most preferably at least about 10 mm or greater, and the bend distance is about 35 mm or less, more preferably at most about 30 mm or less, and most preferably at most about 25 mm or less. It is contemplated that the portion of the Sheathing Element that flexes during the installation as the pre-bend is flattened out during installation is preferably in the upper body portion 200, most preferably above the nail locations. This is preferable so as to minimize the stress in the photovoltaic region 100.

Array of Devices 1000

An array of devices (e.g. PV Sheathing Elements 10, spacer devices "S", edge pieces "E", etc) function to provide electrical energy when subjected to solar radiation (e.g. sunlight). An array is a collection of interconnected devices as installed on a building structure 1100. For the purposes of this invention, it is contemplated that the array 1000 is installed directly on an existing roof deck (or exterior surface) of a building structure 1100, or over a previously installed roofing material (e.g. asphalt Sheathing Elements), in the same way traditional roofing Sheathing Elements are applied (unless otherwise noted herein). These arrays 1000 may be made up of two or more rows of adjoining devices, the rows containing at least two or more devices themselves. As an illustrative example, as shown in FIG. 8 the array 1000 presented has 4 rows, with 3 devices per row and shared edge pieces on each end (PV Sheathing Element 10, edge piece "E", spacer device "S"). An edge piece "E" generally functions to connect multiple rows of devices together, and may or may not include other functional elements. A spacer device "S" generally may function to connect devices within a row, and may or may not include other functional elements.

Method

It is contemplated that at least part of the invention is a method of installation of the devices (e.g. PV Sheathing Element 10, edge piece "E", spacer device "S") in the array. The method may include the steps of: a: providing a first array device affixed to a building structure; b: providing a second array device affixed to the building structure, separated from the first device by a space; c: providing the assembly as described above the sheathing element having a lateral dimension less than the space; d: positioning the assembly of as described above into the space between the first and second array devices; e: connecting the first connector assembly to form an electrical connection to the first array device; and f: connecting the second connector assembly to form an electrical connection to the second array device.

It is also contemplated that the method may further include one or more steps, including: the step of securing the sheathing element to the building structure, the securing step occurring between steps d and e, between steps e and f, after step f, or any combination thereof; one or more of the connecting steps include flexing the flexible portion of the connector assembly to facilitate engagement of the electrical connection; the steps of providing a cover plate and securing the cover plate to the replacement Sheathing Element; the steps of providing a sealing material and placing the sealing material into the connector pocket It is contemplated that the embodiments or examples described above may not be mutually exclusive and may be used in combination with each other.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention. Unless otherwise stated, the coefficient of linear expansion ("CLTE") for the materials and assemblies disclosed herein is determined on a TA Instruments TMA Model 2940 by test method ASTM E1824-08 (2008) in a temperature range of −40° C. and 90° C., at 5° C. per minute, using the standard software provided with the instrument. The skilled artisan will appreciate that a composition may exhibit temperature ranges where the CLTE changes from other regions as the material undergoes thermal transitions. In such a case, the preferred ranges for CLTE above refer to the largest measured CLTE for the compositions, assemblies and/or barrier layer 122. A photovoltaic device may include many different materials, including materials with very different CLTE. For example, a PV assembly may include solar cells, metal conductors, polymeric encapsulants, barrier materials such as glass, or other disparate materials, all with different CLTE's. The CLTE of a PV assembly may be determined by measuring the dimensions of the assembly at a number of temperatures between −40° C. and 90° C. This temperature range is also assumed for all other physical properties (testing) unless otherwise specified.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints. The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination. The use of the terms "comprising" or "including" describing combinations of elements, ingredients, components or steps herein also contemplates embodiments that consist essentially of the elements, ingredients, components or steps. Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements ingredients, components or steps.

What is claimed is:

1. An assembly comprising:
a photovoltaic sheathing element capable of being affixed on a building structure, the sheathing element including at least:
a photovoltaic cell assembly,
a body portion attached to one or more portions of the photovoltaic cell assembly;
at least a first connector assembly and a second connector assembly disposed on opposing sides of the photovoltaic sheathing element and capable of directly or indirectly electrically connecting the photovoltaic cell assembly to at least two adjoining devices that are affixed to the building structure and wherein at least one of the first connector assembly and the second connector assembly includes: a first connector portion, a second connector portion, and a flexible portion extending between and connecting the first connector portion to the second connector portion;
one or more connector pockets are disposed in the body portion within a distance from an outer edge of the body portion where the one or more connector pockets are capable of receiving at least a portion of the first connector assembly or the second connector assembly; and
wherein the first connector portion is located in the one or more connector pockets and connected to the photovoltaic cell assembly, the second connector portion is capable of moving so that the second connector portion extends into a connector in one of the at least two adjoining devices, and the flexible portion allows the second connector portion to move relative to the first connector portion.

2. The assembly according to claim 1, including a cover plate that as assembled protects one or more portions of the one or more connector pockets, one or more portions of the connector assembly, or both.

3. The assembly according to claim 1, including a sealing material disposed in the one or more connector pockets capable of protecting one or more portions of the first connector assembly, the second connector assembly, or both.

4. The assembly according to claim 2, wherein the cover plate positions and maintains location of one or more portions of the first connector assembly, the second connector assembly, or both.

5. The assembly according to claim 1, wherein the first connector assembly, the second connector assembly, or both are mechanically connected to the photovoltaic cell assembly.

6. The assembly according to claim 1, wherein the first connector assembly, the second connector assembly, or both are bonded to the photovoltaic cell assembly.

7. The assembly according to claim 1, wherein: the first connector assembly and the second connector assembly are a separate component;
wherein the photovoltaic sheathing element includes a connector mating component electrically connected to the photovoltaic cell assembly;
wherein the flexible portion is capable of bending such that the second connector portion can move at least a distance equal to an interface length of either the first connector assembly or the second connector assembly.

8. The assembly according to claim 1, wherein disposed within the one or more connector pockets is a bridging portion; the bridging portion including one or more of:
a first feature capable of locating the first connector assembly or the second connector assembly, securing the first connector assembly or the second connector assembly, or both;
a second feature capable of locating a cover plate, securing the cover plate, or both;
a structural portion that connects the photovoltaic cell assembly to the body portion of the assembly.

9. The assembly according to claim 1, wherein the one or more connector pockets disposed in the body portion are at least partially co-extensive with the outer edge of the body portion and include an open end that extends through the outer edge of the body portion.

10. The assembly according to claim 9, wherein at least one of the one or more connector pockets include a strip at the open end that forms a bridge and the first connector assembly, the second connector assembly, or both fit under the strip to extend out of the open end.

11. The assembly according to claim 9, wherein the body portion includes a top side, a bottom side, and the outer edge extending between and connecting the top side and the bottom side.

12. The assembly of claim 11, wherein the first connector assembly extends out of the body portion at least a distance equal to an interface length so that the first connector housing engages with the one or more adjoining array devices.

13. The assembly of claim 1, wherein the flexible portion is a locally flexible joints.

14. The assembly of claim 1, wherein the one or more connector pockets extend completely through the body portion from an upper surface to a lower surface of the body portion, are a depression in one or both of the upper surface and the lower surface, of a combination of either.

15. An photovoltaic sheathing element kit capable of being affixed on a building structure comprising:
   a photovoltaic sheathing element, the sheathing element including at least:
   a photovoltaic cell assembly,
   a body portion attached to one or more portions of the photovoltaic cell assembly;
   at least a first connector assembly and a second connector assembly capable of directly or indirectly electrically connecting the photovoltaic cell assembly to one or more adjoining array devices that is affixed to the building structure and wherein at least one of the first connector assembly and the second connector assembly includes: a first connector portion, a second connector portion, and a flexible portion extending between and connecting the first connector portion to the second connector portion;
   one or more connector pockets disposed in the body portion within a distance from an outer edge of the body portion where the one or more connector pockets are capable of receiving the flexible portion of the first connector assembly or the second connector assembly; and
   wherein the first connector portion is located in the one or more connector pockets and connected to the photovoltaic cell assembly, the second connector portion is capable of moving so that the second connector portion extends into a connector in an adjoining array device, and the flexible portion allows the second connector portion to move relative to the first connector portion.

16. The kit according to claim 15, further comprising a cover plate that as assembled protects one or more portions of the one or more connector pockets and a sealing material capable of being disposed in or about the one or more portions of the one or more connector pockets.

* * * * *